US012216970B2

(12) United States Patent
Parekh et al.

(10) Patent No.: US 12,216,970 B2
(45) Date of Patent: *Feb. 4, 2025

(54) DYNAMIC DIMENSIONING INDICATORS

(71) Applicant: Procore Technologies, Inc., Carpinteria, CA (US)

(72) Inventors: Ritu Parekh, San Jose, CA (US); David McCool, Carpinteria, CA (US); Christopher Myers, Council, ID (US); Christopher Bindloss, Santa Barbara, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/528,411

(22) Filed: Dec. 4, 2023

(65) Prior Publication Data
US 2024/0184955 A1 Jun. 6, 2024

Related U.S. Application Data

(63) Continuation of application No. 17/987,267, filed on Nov. 15, 2022, now Pat. No. 11,836,422, which is a
(Continued)

(51) Int. Cl.
*G06F 30/23* (2020.01)
*G06F 3/04815* (2022.01)
(Continued)

(52) U.S. Cl.
CPC .......... *G06F 30/23* (2020.01); *G06F 3/04815* (2013.01); *G06F 3/04845* (2013.01);
(Continued)

(58) Field of Classification Search
CPC ......... G06F 19/00; G06T 3/10; G06T 11/203; G06T 17/20; G06T 2200/24;
(Continued)

(56) References Cited

U.S. PATENT DOCUMENTS

| 5,623,583 | A | 4/1997 | Nishino |
| 7,639,267 | B1 | 12/2009 | Desimone et al. |

(Continued)

FOREIGN PATENT DOCUMENTS

| KR | 101530895 B1 | 6/2015 |
| KR | 10-1603622 B1 | 3/2016 |
| KR | 10-2018-0131471 A | 12/2018 |

OTHER PUBLICATIONS

"3D Measurement", StreamBIM, https://guide.streambim.com/hc/en-us/articles/360014206773-3D-Measurement, downloaded from the Internet Jul. 9, 2020, 1 page.
(Continued)

*Primary Examiner* — Chong Wu
(74) *Attorney, Agent, or Firm* — Lee Sullivan Shea & Smith LLP

(57) ABSTRACT

An example computing system is configured to (i) generate a cross-sectional view of a three-dimensional drawing file; (ii) receive a first user input indicating a selection of a first mesh, wherein the selection comprises a selection point that establishes a first end point; (iii) generate a first representation indicating an alignment of the first end point with at least one corresponding geometric feature of the first mesh and a second representation indicating a set of one or more directions; (iv) receive a second user input indicating a given direction; (v) based on receiving the second user input, generate a dynamic representation of the dimensioning information along the given direction; (vi) receive a third user input indicating that the second user input is complete; (vii) based on receiving the third user input, add the dimensioning information to the cross-sectional view between the first end point and the second end point.

20 Claims, 22 Drawing Sheets
(7 of 22 Drawing Sheet(s) Filed in Color)

Related U.S. Application Data continuation of application No. 17/346,632, filed on Jun. 14, 2021, now Pat. No. 11,501,040, which is a continuation-in-part of application No. 17/138,551, filed on Dec. 30, 2020, now Pat. No. 11,409,929, which is a continuation of application No. 16/926,038, filed on Jul. 10, 2020, now Pat. No. 10,943,038, which is a continuation-in-part of application No. 16/594,398, filed on Oct. 7, 2019, now Pat. No. 10,950,046.

(51) Int. Cl.
*G06F 3/04845* (2022.01)
*G06F 30/12* (2020.01)
*G06T 17/20* (2006.01)
*G06T 19/20* (2011.01)

(52) U.S. Cl.
CPC ............ *G06F 30/12* (2020.01); *G06T 17/205* (2013.01); *G06T 19/20* (2013.01)

(58) Field of Classification Search
CPC ............ G06T 2210/04; G06T 2210/21; G06T 2219/012; G06T 15/20; G06T 17/205; G06T 19/20; G06F 3/04842; G06F 2203/04806; G06F 3/04815; G06F 30/23; G06F 3/04845; G06F 30/12; G06F 30/13; G06F 30/17
See application file for complete search history.

(56) References Cited

U.S. PATENT DOCUMENTS

| | | |
|---|---|---|
| 10,706,618 B2 | 7/2020 | Hopper et al. |
| 11,501,040 B2 * | 11/2022 | Parekh ................ G06T 17/205 |
| 11,836,422 B2 * | 12/2023 | Parekh ................ G06F 3/04815 |
| 2003/0210244 A1 | 11/2003 | Sasago et al. |
| 2010/0194743 A1 | 8/2010 | Glueck et al. |
| 2011/0320182 A1 | 12/2011 | Dommisse et al. |
| 2012/0188236 A1 | 7/2012 | Legendre |
| 2015/0049081 A1 | 2/2015 | Coffey et al. |
| 2016/0364504 A1 | 12/2016 | Vanker et al. |
| 2017/0148227 A1 | 5/2017 | Alsaffar et al. |
| 2017/0286567 A1 | 10/2017 | Hana |
| 2018/0160160 A1 | 6/2018 | Swaminathan et al. |
| 2018/0350134 A1 | 12/2018 | Lodato et al. |
| 2019/0197759 A1 | 6/2019 | Huang et al. |

OTHER PUBLICATIONS

"Quick Measure—One Click Measure", StreamBIM, https://guide.streambim.com/hc/en-us/articles/360014215080-Quick-Measure-One-Click-Measure, downloaded from the Internet Jul. 9, 2020, 3 pages.

"Quick Measure—Two Click Measure", StreamBIM, https://guide.streambim.com/hc/en-us/articles/360014293999- Quick-measure-Two-click-measure, downloaded from the Internet Jul. 9, 2020, 3 pages.

"StreamBIM Measurement", YouTube, https://www.youtube.com/watch?v=iAKBmkm83lk, downloaded from the Internet Jul. 9, 2020, 1 page.

PCT International Search Report and Written Opinion, PCT International Application No. PCT/US2020/054590, dated Jan. 26, 2021, 10 pages.

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

EP Extended Search Report, EP Application No. 20875015.8, dated Sep. 28, 2023, 13 pages.

* cited by examiner

DYNAMIC DIMENSIONING INDICATORS

CROSS-REFERENCE TO RELATED APPLICATIONS

This application is a continuation of U.S. application Ser. No. 17/987,267, filed on Nov. 15, 2022, and titled "Dynamic Dimensioning Indicators," which is a continuation of U.S. application Ser. No. 17/346,632, filed on Jun. 14, 2021, issued as U.S. Pat. No. 11,501,040, and titled "Dynamic Dimensioning Indicators," which is a continuation-in-part of U.S. application Ser. No. 17/138,551, filed on Dec. 30, 2020, issued as U.S. Pat. No. 11,409,929, and titled "Dynamic Adjustment of Cross-Sectional Views," which is a continuation of U.S. application Ser. No. 16/926,038, filed on Jul. 10, 2020, issued as U.S. Pat. No. 10,943,038, and titled "Dynamic Adjustment of Cross-Sectional Views," which is a continuation-in-part of U.S. application Ser. No. 16/594,398, filed on Oct. 7, 2019, issued as U.S. Pat. No. 10,950,046, and titled "Generating Two-Dimensional Views with Gridline Information," the contents of each of which are incorporated by reference herein in their entirety.

BACKGROUND

Construction projects are often complex endeavors involving the coordination of many professionals across several discrete phases. Typically, a construction project commences with a design phase, where architects design the overall shape and layout of a construction project, such as a building. Next, engineers engage in a planning phase where they take the architects' designs and produce engineering drawings and plans for the construction of the project. At this stage, engineers may also design various portions of the project's infrastructure, such as HVAC, plumbing, electrical, etc., and produce plans reflecting these designs as well. After, or perhaps in conjunction with, the planning phase, contractors may engage in a logistics phase to review these plans and begin to allocate various resources to the project, including determining what materials to purchase, scheduling delivery, and developing a plan for carrying out the actual construction of the project. Finally, during the construction phase, construction professionals begin to construct the project based on the finalized plans.

Overview

As a general matter, one phase of a construction project involves the creation, review, and sometimes revision, of plans of the construction project. In most cases, these plans comprise visual representations of the construction project that visually communicate information about the construction project, such as how to assemble or construct the project. Such visual representations tend to take one of at least two different forms. One form may be a two-dimensional technical drawing, such as an architectural drawing or a construction blueprint, in which two-dimensional line segments of the drawing represent certain physical elements of the construction project like walls and ducts. In this respect, a two-dimensional technical drawing could be embodied either in paper form or in a computerized form, such as an image file (e.g., a PDF, JPEG, etc.).

Two-dimensional technical drawings have advantages. For instance, they are often set out in a universally recognized format that most, if not all, construction professionals can read and understand. Further, they are designed to be relatively compact, with one drawing being arranged to fit on a single piece of paper or in a computerized file format that requires minimal processing power and computer storage to view (e.g., a PDF viewer, JPEG viewer, etc.). Yet, two-dimensional drawings have disadvantages as well. For instance, it often takes multiple drawings in order to visually communicate an overview of an entire construction project. This is because two-dimensional drawings tend not to efficiently present information about the construction project from a third (e.g., vertical) dimension. For example, a construction project may have at least one two-dimensional technical drawing per floor of the construction project. Thus, for a construction project spanning, say, ten floors, the construction project will have at least ten two-dimensional technical drawings, and likely more to fully visually communicate the various aspects of the construction project.

To advance over two-dimensional technical drawings, computerized, three-dimensional technology was developed as another form in which information about a construction project can be visually communicated. In this respect, a three-dimensional model of the construction project would be embodied in a computerized form, such as in a building information model (BIM) file, with three-dimensional meshes visually representing the physical elements of the construction project (e.g., walls, ducts, etc.). Specialized software is configured to access the BIM file and render a three-dimensional view of the construction project from one or more perspectives. This provides some advantages over two-dimensional technical drawings, namely that a construction professional could often get a more complete overview of the construction project based on a single three-dimensional view and thus may not have to shuffle through multiple two-dimensional drawings in order to conceptualize what the construction project looks like. In addition, the specialized software allows a construction professional to navigate throughout the three-dimensional view of the BIM file and focus on elements of interest in the construction project, such as a particular wall or duct.

However, existing technology for presenting visual representations of construction projects has several limitations. For example, one such limitation is that existing software tools for rendering three-dimensional views of construction projects do not provide all the information about a construction project that may be available on certain two-dimensional technical drawings. For instance, dimensioning information for certain physical elements of a construction project may not be presented on a three-dimensional view of a construction project as doing so may clutter or obscure the three-dimensional presentation. Such information is more aptly displayed on an appropriate two-dimensional drawing.

In many cases, gridlines for a construction project are established by an architect or engineer during the design process. The gridlines may be established at regular intervals (e.g., every 20 feet) and are usually based on a datum, or set of coordinates, referred to as "universal coordinates." Universal coordinates are generally (although not always) independent of the construction project and derive from one or more universal location sources such as a particular latitude/longitude, or one or more GIS benchmarks, etc. The gridlines are then calculated using offsets from a universal origin point that is based on the universal coordinates. Accordingly, some construction files may reflect the location of elements within the construct project (e.g., walls, ducts, etc.) with dimensional references to the gridlines by overlaying the gridlines on various two-dimensional views of the construction project.

However, some software tools that use BIM files to generate three-dimensional views of the construction project typically will not reflect the location of these gridlines, nor do the BIM files themselves. This is because BIM files are often based on a construction-project specific datum, sometimes referred to as "virtual coordinates," rather than the universal coordinates discussed above. Virtual coordinates typically set a point within the construction project as the origin (e.g., a building corner, or a property boundary of the construction project, etc.) and then the location of the various construction elements within the BIM file are determined based on this origin point.

Yet another limitation with existing technology for presenting visual representations of construction projects is that, in some situations, neither a two-dimensional technical drawing nor a three-dimensional view readily provides the particular information about the construction project that is needed. For instance, consider a scenario where construction plans call for a plumbing layout that includes a pipe passing through a wall. A construction professional that is installing the wall-before the pipe is present—might wish to locate the intersection between the wall and the eventual pipe so as to create a penetration through the wall in the correct location. The horizontal and/or vertical dimensioning information for doing so might not be included on any two-dimensional technical drawings or in any two-dimensional views of a BIM file.

In scenarios like these, the construction professional would typically derive this information based on his or her own calculations, accounting for, among other things, the dimensions of the pipe, the designed pitch of the pipe, if any, and the distance of the pipe/wall intersection from another point where the vertical elevation of the pipe is known. Such manual calculations can be time-consuming, can create the possibility for errors, both of which are issues that are multiplied with each calculation that must be performed.

To address these problems and others, disclosed herein is a software application that enables a computing device to plot the location of gridlines within two-dimensional views that are generated based on a three-dimensional BIM file, and then provide dynamic dimensioning information that is based on the gridlines. In this respect, the disclosed software technology provides a flexible solution that can readily provide needed information about a construction project.

At a high level, the disclosed software application enables a construction professional to generate a two-dimensional view of a three-dimensional drawing file, such as a BIM file, that includes gridline information from a related two-dimensional drawing file and dimensioning information based thereon. This may facilitate the efficient location of physical elements within a construction projection.

The processes discussed herein may involve extracting gridline information from a two-dimensional drawing file and inserting the gridline information into a two-dimensional view that is generated from a three-dimensional BIM file. For instance, the software application may translate the gridline information from a first coordinate system used in the two-dimensional drawing file to a second coordinate system used by the three-dimensional BIM file. The software application may also add dimensioning information to the generated two-dimensional view of the BIM file that can use the gridlines as a reference point. Further, the software application may dynamically update the dimensioning information in the two-dimensional view in response to a user adjusting the view by, for example, zooming in or out of the view, or controlling the parameters and depth of a given cross-sectional view. Each of these processes, which may take various forms and may be carried out in various manners, are described in further detail below.

Accordingly, in one aspect, disclosed herein is a method that involves (1) extracting gridline information from a two-dimensional drawing file; (2) determining, for the gridline information, first coordinate information that is based on a first datum; (3) converting the first coordinate information into second coordinate information that is based on a second datum, wherein the second coordinate information is used by a three-dimensional drawing file; (4) receiving a request to generate a two-dimensional view of the three-dimensional drawing file, wherein the two-dimensional view includes an intersection of two meshes within the three-dimensional drawing file; (5) generating the two-dimensional view of the three-dimensional drawing file; and (6) adding, to the generated two-dimensional view, (i) at least one gridline corresponding to the gridline information and (ii) dimensioning information involving the at least one gridline and at least one of the two meshes.

In a second aspect, disclosed herein is a method that involves (1) receiving a request to generate a cross-sectional view of a three-dimensional drawing file, where the cross-sectional view is based on a location of a cross-section line within the three-dimensional drawing file and includes an intersection of two meshes within the three-dimensional drawing file; (2) generating the cross-sectional view of the three-dimensional drawing file; (3) adding, to the generated cross-sectional view, dimensioning information involving at least one of the two meshes; (4) generating one or more controls for adjusting a location of the cross-section line within the three-dimensional drawing file; and (5) based on an input indicating a selection of the one or more controls, (i) adjusting the location of the cross-section line within the three-dimensional drawing file; (ii) updating the cross-sectional view based on the adjusted location of the cross-section line; and (iii) updating the dimensioning information to correspond to the updated cross-sectional view.

In a third aspect, disclosed herein is a method that involves: (i) generating a cross-sectional view of a three-dimensional drawing file, wherein the cross-sectional view includes an intersection of at least two meshes within the three-dimensional drawing file; (ii) receiving a first user input indicating a selection of a first mesh, wherein the selection comprises a first selection point that establishes a first end point for dimensioning information; (iii) based on receiving the first user input: (1) generating a first representation indicating an alignment of the first end point with at least one corresponding geometric feature of the first mesh and (2) generating a second representation indicating a set of one or more directions, originating from the first end point, along which the dimensioning information may be added to the cross-sectional view; (iv) receiving a second user input indicating a given direction, from the set of one or more directions, along which the dimensioning information is to be added; (v) based on receiving the second user input, generating a dynamic representation of the dimensioning information along the given direction, originating from the first end point to a second end point; (vi) receiving a third user input indicating that the second user input is complete; and (vii) based on receiving the third user input, adding the dimensioning information to the cross-sectional view between the first end point and the second end point.

In a fourth aspect, disclosed herein is a computing system that includes a network interface, at least one processor, a non-transitory computer-readable medium, and program instructions stored on the non-transitory computer-readable medium that are executable by the at least one processor to cause the computing system to carry out the functions disclosed herein, including but not limited to the functions of the foregoing methods.

In a fifth aspect, disclosed herein is a non-transitory computer-readable storage medium provisioned with software that is executable to cause a computing system to carry out the functions disclosed herein, including but not limited to the functions of the foregoing methods.

One of ordinary skill in the art will appreciate these as well as numerous other aspects in reading the following disclosure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Figure 1:
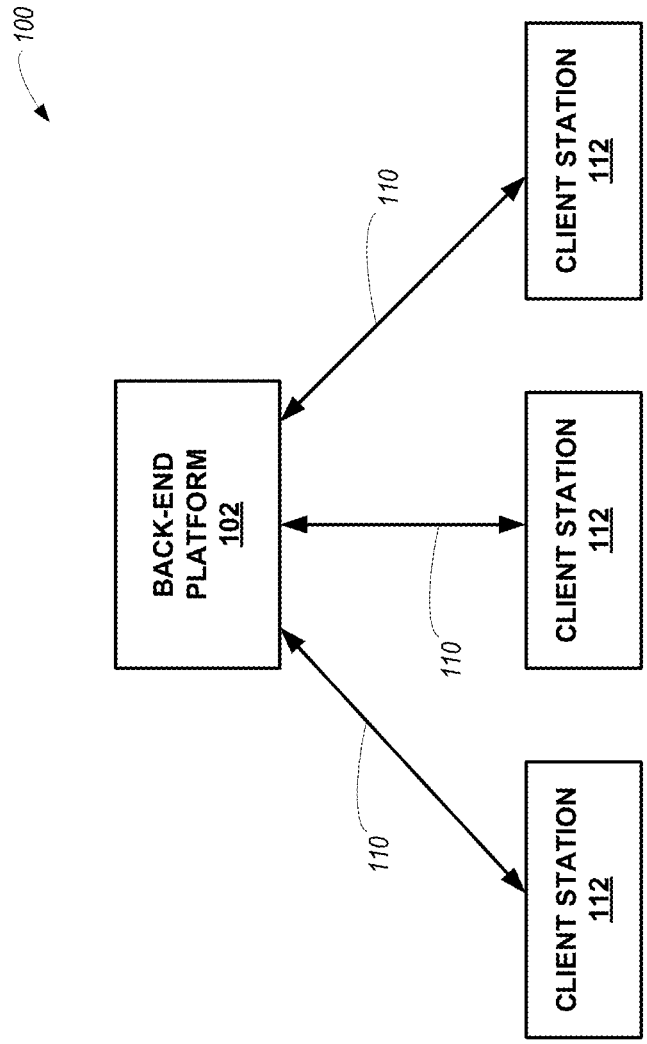
FIG. 1 depicts an example network configuration in which example embodiments may be implemented.

Features, aspects, and advantages of the presently disclosed technology may be better understood with regard to the following description, appended claims, and accompanying drawings, as listed below. The drawings are for the purpose of illustrating example embodiments, but those of ordinary skill in the art will understand that the technology disclosed herein is not limited to the arrangements and/or instrumentality shown in the drawings.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. Example System Configuration

As described above, the present disclosure is generally directed to an improved software application that enables a computing system to plot the location of gridlines within two-dimensional views that are generated based on a three-dimensional BIM file, provide dynamic dimensioning information that is based on the gridlines, and/or add dimensioning information to the two-dimensional views based on user input(s). This may facilitate the layout and construction of a given project in a more accurate and convenient manner.

As one possible implementation, this software technology may include both front-end software running on client stations that are accessible to individuals associated with construction projects (e.g., contractors, project managers, architects, engineers, designers, etc.) and back-end software running on a back-end platform (sometimes referred to as a "cloud" platform) that interacts with and/or drives the front-end software, and which may be operated (either directly or indirectly) by the provider of the front-end client software. As another possible implementation, this software technology may include front-end client software that runs on client stations without interaction with a back-end platform. The software technology disclosed herein may take other forms as well.

In general, such front-end client software may enable one or more individuals responsible for a construction project to perform various tasks related to the management and construction of the project, which may take various forms. According to some implementations, these tasks may include: rendering three-dimensional views of the construction project, navigating through the various three-dimensional views of the construction project in order to observe the construction project from various perspectives, using the software to generate two-dimensional drawings, which may be based on two-dimensional views of a three-dimensional drawing file, and adding dimensioning information based on receiving a series of user inputs, as some non-limiting examples. Further, such front-end client software may take various forms, examples of which may include a native application (e.g., a mobile application) and/or a web application running on a client station, among other possibilities.

Turning now to the figures, FIG. 1 depicts an example network configuration 100 in which example embodiments of the present disclosure may be implemented. As shown in FIG. 1, network configuration 100 includes a back-end platform 102 that may be communicatively coupled to one or more client stations, depicted here, for the sake of discussion, as three client stations 112.

In general, back-end platform 102 may comprise one or more computing systems that have been provisioned with software for carrying out one or more of the platform functions disclosed herein, including but not limited to functions related to the disclosed process of plotting the location of gridlines within two-dimensional views that are generated based on a three-dimensional BIM file, and then providing dynamic dimensioning information based thereon. The one or more computing systems of back-end platform 102 may take various forms and be arranged in various manners.

For instance, as one possibility, back-end platform 102 may comprise computing infrastructure of a public, private, and/or hybrid cloud (e.g., computing and/or storage clusters) that has been provisioned with software for carrying out one or more of the platform functions disclosed herein. In this respect, the entity that owns and operates back-end platform 102 may either supply its own cloud infrastructure or may obtain the cloud infrastructure from a third-party provider of "on demand" computing resources, such include Amazon Web Services (AWS) or the like. As another possibility, back-end platform 102 may comprise one or more dedicated servers that have been provisioned with software for carrying out one or more of the platform functions disclosed herein. Other implementations of back-end platform 102 are possible as well.

In turn, client stations 112 may each be any computing device that is capable of running the front-end software disclosed herein. In this respect, client stations 112 may each include hardware components such as a processor, data storage, a user interface, and a network interface, among others, as well as software components that facilitate the client station's ability to run the front-end software disclosed herein (e.g., operating system software, web browser software, etc.). As representative examples, client stations 112 may each take the form of a desktop computer, a laptop, a netbook, a tablet, a smartphone, and/or a personal digital assistant (PDA), among other possibilities.

As further depicted in FIG. 1, back-end platform 102 is configured to interact with one or more client stations 112 over respective communication paths 110. Each communication path 110 between back-end platform 102 and one of client stations 112 may generally comprise one or more communication networks and/or communications links, which may take any of various forms. For instance, each respective communication path 110 with back-end platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 with back-end platform 102 may be wireless, wired, or some combination thereof, and may carry data according to any of various different communication protocols. Although not shown, the respective communication paths 110 with back-end platform 102 may also include one or more intermediate systems. For example, it is possible that back-end platform 102 may communicate with a given client station 112 via one or more intermediary systems, such as a host server (not shown). Many other configurations are also possible.

The interaction between client stations 112 and back-end platform 102 may take various forms. As one possibility, client stations 112 may send certain user input related to a construction project to back-end platform 102, which may in turn trigger back-end platform 102 to take one or more actions based on the user input. As another possibility, client stations 112 may send a request to back-end platform 102 for certain project-related data and/or a certain front-end software module, and client stations 112 may then receive project-related data (and perhaps related instructions) from back-end platform 102 in response to such a request. As yet another possibility, back-end platform 102 may be configured to "push" certain types of project-related data to client stations 112, such as rendered two-dimensional or three-dimensional views, in which case client stations 112 may receive project-related data (and perhaps related instructions) from back-end platform 102 in this manner. As still another possibility, back-end platform 102 may be configured to make certain types of project-related data available via an API, a service, or the like, in which case client stations 112 may receive project-related data from back-end platform 102 by accessing such an API or subscribing to such a service. The interaction between client stations 112 and back-end platform 102 may take various other forms as well.

In practice, client stations 112 may each be operated by and/or otherwise associated with a different individual that is associated with a construction project. For example, an individual tasked with the responsibility for creating project-related data, such as data files defining three-dimensional models of a construction project, may access one of the client stations 112, whereas an individual tasked with the responsibility for reviewing and revising data files defining three-dimensional models of a construction project may access another client station 112, whereas an individual tasked with the responsibility for physically constructing the elements shown in the drawings, such as an on-site construction professional, may access yet another client station 112. Client stations 112 may be operated by and/or otherwise associated with individuals having various other roles with respect to a construction project as well. Further, while FIG. 1 shows an arrangement in which three particular client stations are communicatively coupled to back-end platform 102, it should be understood that a given arrangement may include more or fewer client stations.

Although not shown in FIG. 1, back-end platform 102 may also be configured to receive project-related data from one or more external data sources, such as an external database and/or another back-end platform or platforms. Such data sources—and the project-related data output by such data sources—may take various forms.

It should be understood that network configuration 100 is one example of a network configuration in which embodiments described herein may be implemented. Numerous other arrangements are possible and contemplated herein. For instance, other network configurations may include additional components not pictured and/or more or less of the pictured components.

II. Example Computing Device

Figure 2:
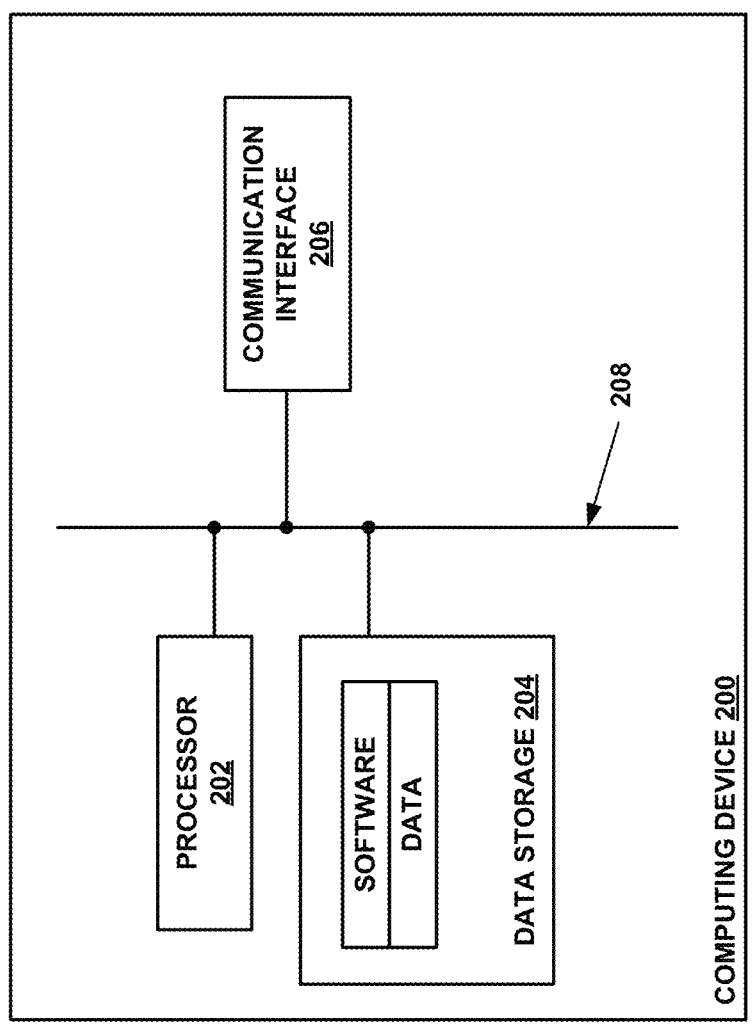
FIG. 2 depicts an example computing platform that may be configured to carry out one or more of the functions of the present disclosure.

FIG. 2 is a simplified block diagram illustrating some structural components that may be included in an example computing device 200, which could serve as, for instance, the back-end platform 102 and/or one or more of client stations 112 in FIG. 1. In line with the discussion above, computing device 200 may generally include at least a processor 202, data storage 204, and a communication interface 206, all of which may be communicatively linked by a communication link 208 that may take the form of a system bus or some other connection mechanism.

Processor 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that processor 202 could comprise processing components that are distributed across a plurality of physical computing devices connected via a network, such as a computing cluster of a public, private, or hybrid cloud.

In turn, data storage 204 may comprise one or more non-transitory computer-readable storage mediums, examples of which may include volatile storage mediums such as random-access memory, registers, cache, etc. and non-volatile storage mediums such as read-only memory, a hard-disk drive, a solid-state drive, flash memory, an optical-storage device, etc. In line with the discussion above, it should also be understood that data storage 204 may comprise computer-readable storage mediums that are distributed across a plurality of physical computing devices connected via a network, such as a storage cluster of a public, private, or hybrid cloud.

As shown in FIG. 2, data storage 204 may be provisioned with software components that enable the platform 200 to carry out the platform-side functions disclosed herein. These software components may generally take the form of program instructions that are executable by the processor 202 to carry out the disclosed functions, which may be arranged together into software applications, virtual machines, software development kits, toolsets, or the like, all of which are referred to herein as a software tool or software tools. Further, data storage 204 may be arranged to store project-related data in one or more databases, file systems, or the like. Data storage 204 may take other forms and/or store data in other manners as well.

Communication interface 206 may be configured to facilitate wireless and/or wired communication with other computing devices or systems, such as one or more client stations 112 when computing device 200 serves as back-end platform 102, or back-end platform 102 when computing device 200 serves as one of client stations 112. Additionally, in an implementation where the computing device 200 comprises a plurality of physical computing devices connected via a network, communication interface 206 may be configured to facilitate wireless and/or wired communication between these physical computing devices (e.g., between computing and storage clusters in a cloud network). As such, communication interface 206 may take any suitable form for carrying out these functions, examples of which may include an Ethernet interface, a serial bus interface (e.g., Firewire, USB 3.0, etc.), a chipset and antenna adapted to facilitate wireless communication, and/or any other interface that provides for wireless and/or wired communication. Communication interface 206 may also include multiple communication interfaces of different types. Other configurations are possible as well.

Although not shown, computing device 200 may additionally include one or more interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with computing device 200.

It should be understood that computing device 200 is one example of a computing device that may be used with the embodiments described herein. Numerous other arrangements are possible and contemplated herein. For instance, other computing devices may include additional components not pictured and/or more or fewer of the pictured components.

III. Example Two- and Three-Dimensional Drawings

As mentioned above, one aspect of managing a construction project involves the creation, review, and sometimes revision, of plans for the construction project. The plans assist construction professionals in carrying out the construction project. For example, some plans include written statements, such a punch list or submittal log, which may communicate, for instance, what materials are needed during construction. Other plans may include visual representations of the construction project that visually communicate to the construction professionals how to assemble or construct the project.

Depending on the type of construction project, these visual representations tend to take one of two different forms. As one possibility, these visual representations may take the form of a set of two-dimensional technical drawings, such as architectural drawings, engineering plans, or construction blueprints, etc. From these two-dimensional technical drawings, the construction professionals can determine how to construct the project. As another possibility, these visual representations may take the form of a computerized, three-dimensional visual representation of the construction project. Construction professionals can use a corresponding software tool to review the three-dimensional visual representation, often in conjunction with a review of two-dimensional technical drawings, as an aid during the construction process. Set forth below is a short overview of each of these types of visual representations of construction projects.

A. Two-Dimensional Technical Drawings

Figure 3:
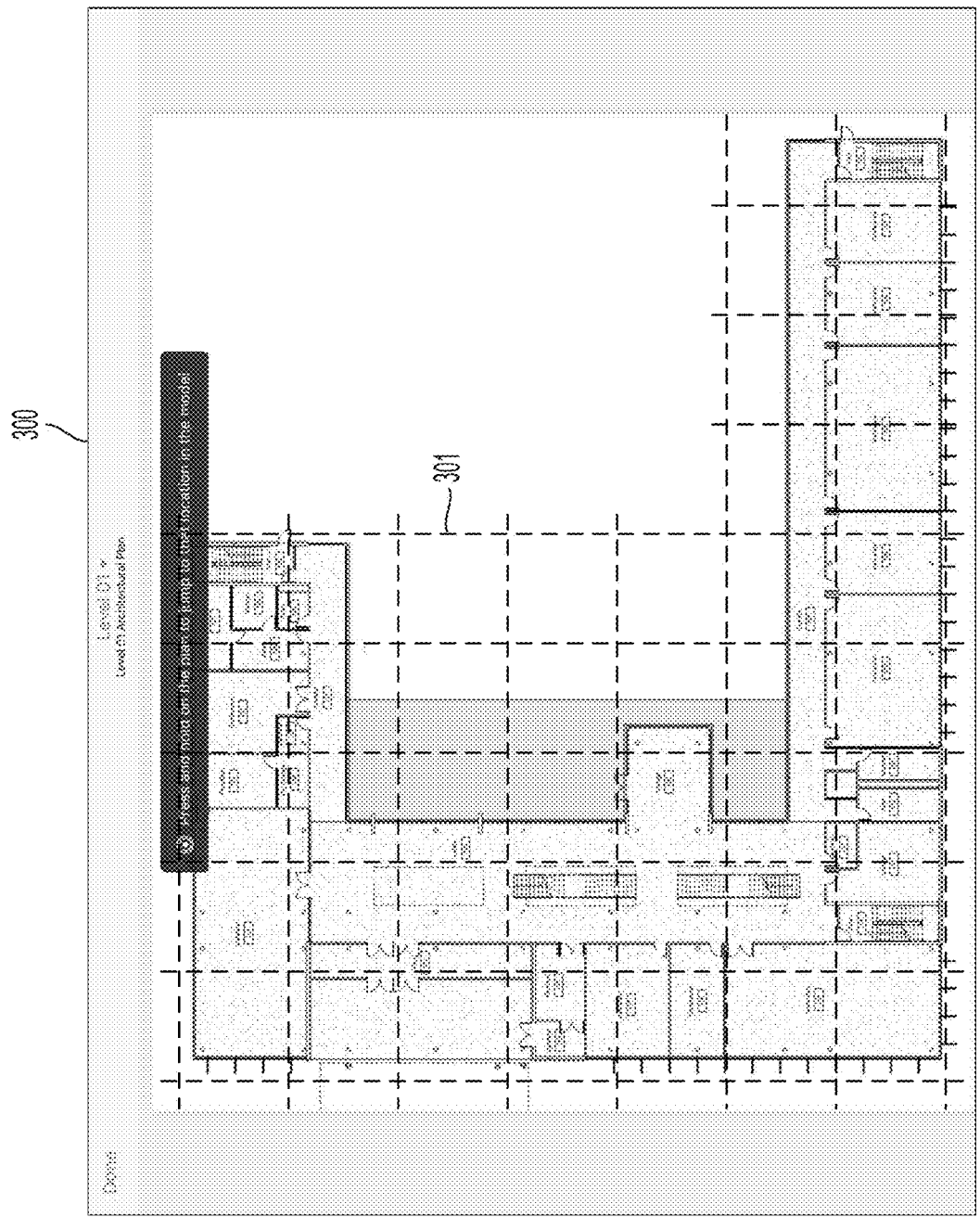
FIG. 3 depicts an example two-dimensional drawing file.

As mentioned, one way to visually represent information about a construction project is through two-dimensional technical drawings. Generally, a two-dimensional technical drawing serves to visually communicate a limited amount of information about the construction project in order to aid in the construction, or the further design, of the project. To illustrate, FIG. 3 depicts one example of a two-dimensional technical drawing 300 in the form of an architectural floor plan of a building, which may visually communicate how the construction project is laid out. An architectural drawing, such as architectural drawing 300, may comprise a scaled drawing depicting certain structural elements of the construction project (e.g., floors, walls, ceilings, doorways, and support elements), with perhaps visual indications of additional relevant aspects of these structural elements, such as measurements, dimensions, materials, etc.

FIG. 3 also shows a set of gridlines 301 overlaid on the two-dimensional technical drawing 300. As noted above, the gridlines 301 shown in the drawing 300 may be based on gridline information that is established by the architect or engineer with reference to a universal location source that is not specific to the construction project. For example, the universal location source may include a set of benchmarks and/or other geographic control data that is maintained at a city or county-wide level, and which can be used for any number of construction projects within that locale. In this way, even unrelated construction projects within the area may utilize a consistent datum. Further, such city or county-wide location sources may be based on one or more national or global location sources, such as a nationwide horizontal datum (e.g., NAD83), a nationwide vertical datum (e.g., NAVD88), one or more latitude or longitude coordinates, or GPS coordinates, among other examples.

As shown in FIG. 3, the gridlines 301 may form a uniform, two-dimensional grid over the construction project, with the individual gridlines repeating every 20 feet, for instance. Accordingly, some two-dimensional drawing files may reflect the location of elements within the construct project (e.g., walls, ducts, etc.) with dimensional references to the nearest gridline(s). Gridlines 301 can provide a useful reference for construction professionals in the field when laying out and constructing elements shown in a two-dimensional drawing, such as the drawing 300.

Another example of a two-dimensional technical drawing is a drawing that visually communicates how the heating, ventilation, and air conditioning (HVAC) ductwork is routed throughout the building. Like the architectural drawing shown in FIG. 3, this schematic may visually communicate the HVAC ductwork routing through the use of a scaled depiction of the ductwork along with indications of other relevant aspects of the ductwork, such as measurements, dimensions, materials, etc. Other two-dimensional drawings, often but not necessarily corresponding to separate design aspects of the construction project are also possible, such as plumbing drawings, electrical drawings, fire protection drawings, and so on. In each case, the drawings may display the gridlines 301, which can be used to provide a common reference from which a construction professional may lay out and construct the different elements of the construction project.

Because technical drawings such as these are limited to two dimensions, multiple technical drawings may be used when there is a need to visually communicate aspects from a third (e.g., vertical) dimension. For instance, a building in a construction project may comprise multiple floors and the design of the project may call for changes in the shape or structure of the building from floor to floor, in addition to changes in the routing, location, and sizing of utilities from floor to floor. Thus, there may be multiple technical drawings for each floor of a building in the construction project.

Similarly, the engineering design of the exterior site may include technical drawings corresponding to underground utilities, stormwater management and erosion control, site grading, roadway and paving design, landscaping plans, and other aspects which may be impractical to including in a single technical drawing. For these reasons, a single construction project may involve the use of tens, hundreds, or perhaps thousands of technical drawings. As noted above, the gridlines 301 may be reflected on some or all of these two-dimensional drawings.

Generally, two-dimensional technical drawings, like the examples described above, are created at the outset of a construction project by architects, designers, engineers, or some combination thereof. Traditionally, these professionals would design such two-dimensional technical drawings by hand. But today, professionals typically design two-dimensional technical drawings with the aid of computer-assisted design (CAD) software, such as existing CAD software known and used by professionals in the industry.

Two-dimensional technical drawings have advantages. For instance, a single two-dimensional technical drawing can visually communicate vast amounts of useful information. In some cases, construction professionals can get an overview of an entire area of a construction project by referring to a single technical drawing. Moreover, once completed and put into final form, technical drawings require a relatively small amount of computer storage and processing power to store and view. Construction professionals can often review finished technical drawings with off-the-shelf software document viewers, such as portable document format (PDF) software viewers.

Yet two dimensional technical drawings also have disadvantages. Because these technical drawings are typically created at the outset of the construction project—that is, well before physical construction has actually begun—these drawings generally will not reflect changes to the project that happen during, say, the construction phase. When a change to the construction project happens after the technical drawings are completed, architects, designers, or engineers may be called upon to revise the existing technical drawings or create new drawings altogether to reflect the change.

Additionally, technical drawings that are generated at the outset of the construction project may not always visually communicate the specific information desired by the construction professional who later accesses the technical drawings. For instance, during construction, a construction professional may determine that it would be useful to have a technical drawing that shows the location, on an interior wall that has just been installed, where a plumbing pipe designed to pass through the wall (but not yet installed) will eventually intersect that wall. However, a technical drawing showing these particular dimensions may not exist. Thus, the construction professional may have to wait for, or go without, his or her desired technical drawing. One solution to this issue would be to call upon an engineer, designer, or architect to generate the technical drawings with the requested information. But this is often a costly and time-consuming process, which may not be feasible depending on the project's budget as well as the stage of construction.

B. Three-Dimensional Visual Representations

Another way to visually represent information about a construction project is through a computerized, three-dimensional model of the construction project. In order to facilitate the creation and use of a computerized, three-dimensional model of the construction project, a team of architects, designers, and/or engineers engages in a process referred to as Building Information Modeling.

As a general matter, Building Information Modeling refers to the process of designing and maintaining a computerized representation of physical and functional characteristics of a construction project, such as a building. Specialized software tools can then access this computerized representation and process it to visually communicate how to construct the building via a navigable, three-dimensional model of the building and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of the building, including walls, floors, and ceilings, as well as the building's infrastructure, including pipes, ducts, conduits, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as a "BIM viewer." A BIM viewer is software that accesses the information contained within a BIM file or a combination of BIM files for a particular construction project and then, based on the file(s), is configured to cause a computing device to render a three-dimensional view of the computerized representation of the construction project. This view is referred to herein as a "three-dimensional BIM view" or simply a "three-dimensional view."

In order for BIM viewer software to be able to cause a computing device to render a three-dimensional view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for the building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project, such as a pipe, as a mesh of geometric triangles (e.g., a triangular irregular network, or TIN) such that when the geometric triangles are visually stitched together by BIM viewer software, the triangles form a mesh or surface, which represents a scaled model of the physical component. In this respect, the BIM file may contain data that represents each triangle of a given mesh as set of coordinates in three-dimensional space ("three-space"). For instance, for each triangle stored in the BIM file, the BIM file may contain data describing the coordinates of each vertex of the triangle (e.g., an x-coordinate, a y-coordinate, and a z-coordinate for the first vertex of the triangle; an x-coordinate, a y-coordinate, and a z-coordinate for the second vertex of the triangle; and an x-coordinate, a y-coordinate, and a z-coordinate for the third vertex of the triangle). A given mesh may be comprised of thousands, tens of thousands, or even hundreds of thousands of individual triangles, where each triangle may have a respective set of three vertices and corresponding sets of three-space coordinates for those vertices. However, other ways for a BIM file to contain data that represents each individual physical component in a construction project are possible as well.

Figure 4:
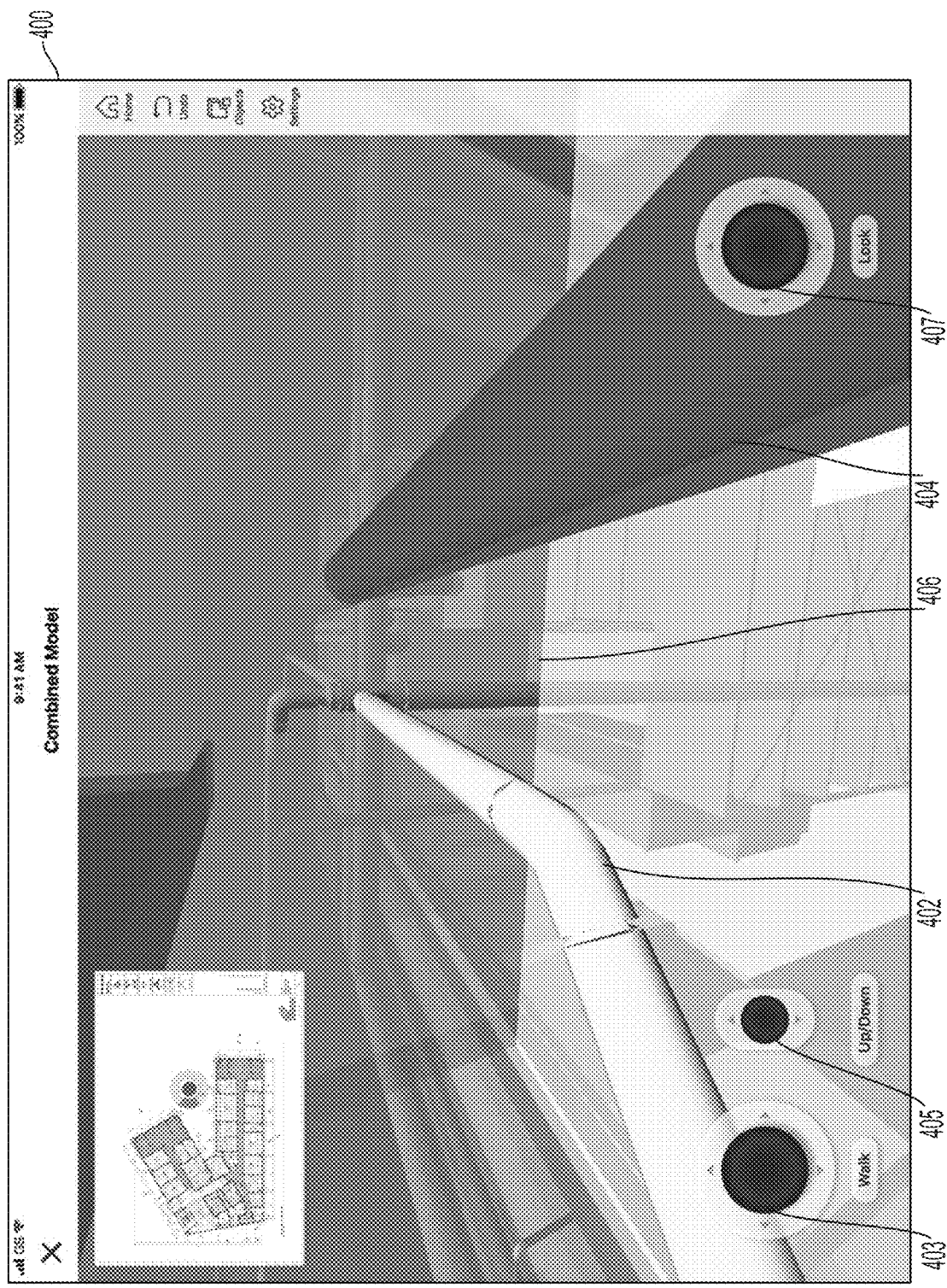
FIG. 4 depicts an example three-dimensional drawing file.

To illustrate one example of a three-dimensional view, FIG. 4 depicts an example snapshot 400 of a GUI that includes a three-dimensional view of a construction project rendered from a particular perspective. Snapshot 400 may be generated by, for instance, a software tool running on a client station, such as one of client stations 112 in FIG. 1, accessing a BIM file and then rendering a three-dimensional view of the construction project based on that BIM file and presenting it via a display interface of the client station 112. Alternatively, a back-end platform, such as back-end platform 102 in FIG. 1, may access a BIM file and may generate a set of instructions for rendering a three-dimensional view of the construction project based on the BIM file. Back-end platform 102 may then send the instructions to one of client stations 112, which in turn may present a three-dimensional view of the construction project via a display interface of that client station based on the instructions. Still other arrangements are possible.

As depicted, snapshot 400 includes a three-dimensional view of a construction project from a particular perspective. The three-dimensional view depicted in FIG. 4 includes a number of meshes that represent individual physical components of the construction project, such as walls, pipes, floors, beams, etc. In particular, depicted in FIG. 4 is, among other things, a mesh 402, which represents a first pipe, a mesh 404, which represents a second pipe, and a mesh 406, which represents a wall. Of course, in other examples, other views and meshes are possible.

The client station presenting snapshot 400 may be configured to adjust the perspective from which the three-dimensional view is presented in response to, for instance, receiving user inputs at the client station. The client station may do this in various ways. As one possibility, the GUI may include a control 403 that may be used to reposition the perspective either forward or backward (along an x-axis) or side to side (along a y-axis) of the model. Similarly, the client station may reposition the perspective either up or down (along a z-axis) of the model in response to a user manipulating control 405. As another example, the client station may reposition the orientation of the perspective (i.e., the "camera" angle) in response to a user manipulating control 407. Other types of controls and inputs for manipulating the three-dimensional view of the BIM file are also possible.

BIM files may also include data describing other attributes of the individual physical elements of the construction project that may or may not be related to the element's specific position in three-space. By way of example, this may include data describing what system or sub-system the component is associated with (e.g., structural, plumbing, HVAC, electrical, etc.), data describing what material or materials the individual physical element is made of; what manufacturer the element comes from; where the element currently resides (e.g., data indicating that the element is on a truck for delivery to the construction site, and/or once delivered, data indicating where on the construction site the delivered element resides); and/or various identification numbers assigned to the element (e.g., a serial number, part number, model number, tracking number, etc.), as well as others.

Together, these other attributes are generally referred to as metadata. BIM viewer software may utilize this metadata in various ways. For instance, some BIM viewer software may be configured to present different views based on selected metadata (e.g., displaying all meshes that represent HVAC components but hiding all meshes that represent plumbing components; and/or displaying meshes representing metal components in a certain color and displaying meshes representing wood components in another color, etc.). BIM viewers can display certain subsets of the metadata based on user input. For example, a user may provide a user input to the BIM viewer software though a click or tap on a GUI portion displaying a given mesh, and in response, the BIM viewer software may cause a GUI to display some or all of the attributes of the physical element represented by the given mesh. Other examples are possible as well.

As mentioned, BIM viewer software is generally deployed on client stations, such as client stations 112 of FIG. 1 (which, as described above, can generally take the form of a desktop computer, a laptop, a tablet, or the like). As such, construction professionals can utilize BIM viewer software during all phases of the construction project and can access a BIM file for a particular construction project in an office setting as well as on the construction site. Accordingly, BIM viewer software assists construction professionals with, among other things, the design and construction of the project and/or to identify issues that may arise during such construction.

BIM technology has advantages. For instance, as described, BIM viewers can use BIM files in order to render three-dimensional views (such as the view depicted in snapshot 400 in FIG. 4) of various elements of the construction project. This can help construction professionals identify potential construction issues prior to encountering those issues during construction as well as conceptualize what the finished building will look like. For instance, the construction professional discussed above who wants to visualize a pipe/wall intersection may utilize a BIM file to generate the snapshot 400. The snapshot 400 may show the first pipe that the construction professional is interested in, represented by mesh 402, as well as the wall, represented by mesh 406.

However, existing BIM technology has certain limitations as well. One limitation is that three-dimensional BIM views may be cumbersome to navigate about and may thus not present information as quickly or efficiently as a two-dimensional technical drawing. Further, three-dimensional BIM views generally require more computing resources to render and display than traditional two-dimensional technical drawings, which, as mentioned, can typically be presented in PDF form. Additionally, while three-dimensional BIM views may display various meshes positioned about the construction project, the three-dimensional BIM view may not display precise measurements associated with each mesh in relation to each other mesh, as doing so may tend to clutter and perhaps obscure the display of the overall project.

Moreover, a three-dimensional BIM file might not utilize a datum that references the same type of universal coordinates discussed above and used by two-dimensional technical drawings. Rather, the BIM file may utilize a virtual coordinate system that is project specific, and that uses a point within the construction project as the origin point for the coordinates of each mesh. For example, a building corner may serve as the origin point for a virtual coordinate system, from which the various construction elements within the BIM file can be located.

However, because the BIM file may not include a reference to the universal coordinate system used by the two-dimensional drawings, the gridlines 301 might not be readily inserted into the BIM file. Thus, the construction professional who generates the three-dimensional view shown in snapshot 400 might not have a convenient reference from which to measure the location of the pipe/wall intersection that would be useful to the construction professional in the field. Thus, it would be useful for the BIM file to incorporate the gridlines information discussed above in such a way that a BIM viewer operating on a client station can display both the gridlines 301 as well as dimensioning information that is based on the gridlines 301.

IV. Example Operations

Disclosed herein is new software technology that is designed to help remedy some of the aforementioned limitations. For instance, disclosed herein is a software tool that generates a two-dimensional view of a given three-dimensional drawing file, where the two-dimensional view incorporates gridlines and dimensioning information that is based on a coordinate system other than the coordinate system used by the three-dimensional drawing file. In a first aspect, the disclosed software technology may cause a computing device to obtain and convert gridline information from a two-dimensional drawing file and provide the gridline information and associated dimensioning information on a generated two-dimensional view of the three-dimensional drawing file. In a second aspect, the disclosed software technology may cause a computing device to dynamically update dimensioning information based on a repositioning of the two-dimensional view by a user. In a third aspect, the disclosed software technology may cause a computing device to provide and dynamically update dimensioning indicators based on receiving one or more user inputs and, in response to receiving the one or more user inputs, add dimensioning information to a generated two-dimensional view of a three-dimensional drawing file.

Example operations that may be carried out by one or more computing devices running the disclosed software technology are discussed in further detail below. For purposes of illustration only, these example operations are described as being carried out by a computing device, such as computing device 200 of FIG. 2. As described above, the computing device 200 may serve as one or more of client stations 112 and/or back-end platform 102 shown in FIG. 1. In this respect, it should be understood that, depending on the implementation, the operations discussed herein below may be carried out entirely by a single computing device, such as one or more of client stations 112 or by back-end platform 102, or may be carried out by a combination of computing devices, with some operations being carried out by back-end platform 102 (such as computational processes and data-access operations) and other operations being carried out by one or more of client stations 112 (such as display operations and operations that receive user inputs). However, other arrangements are possible as well.

Figure 5:
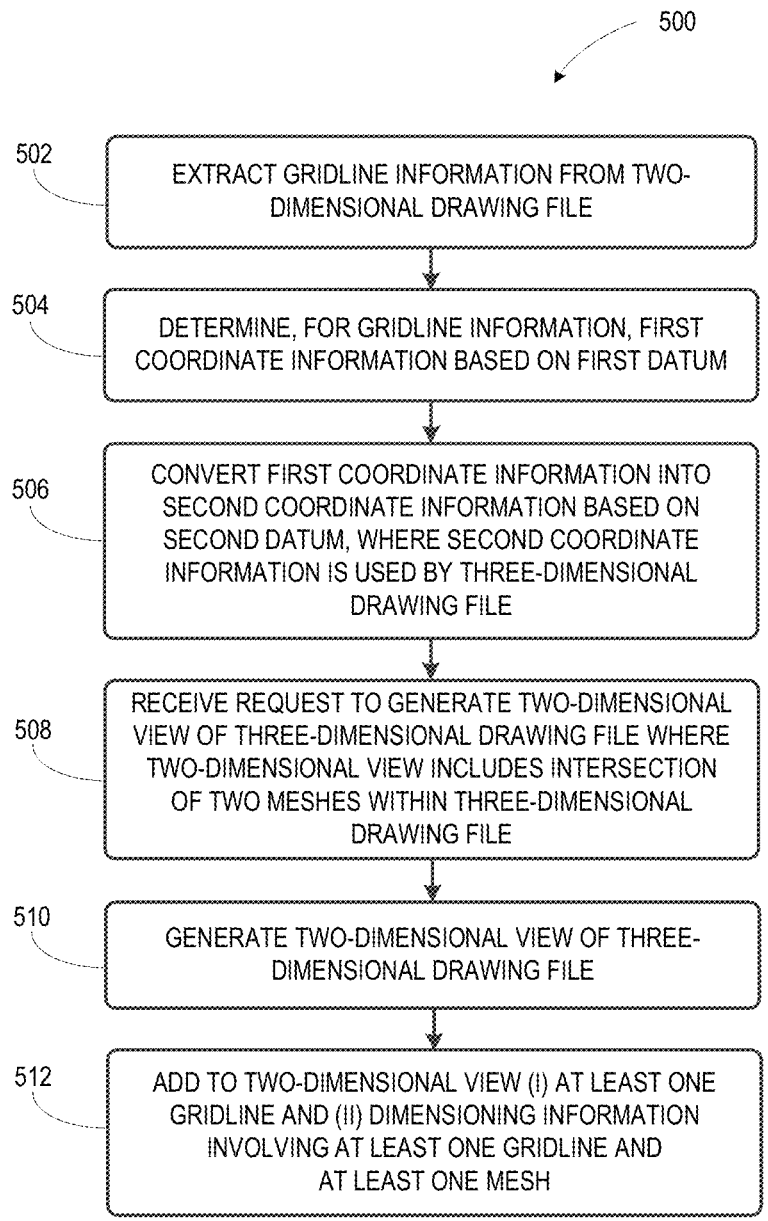
FIG. 5 depicts an example flow chart that may be carried out to facilitate generating two-dimensional views with gridline information.
Figure 8:
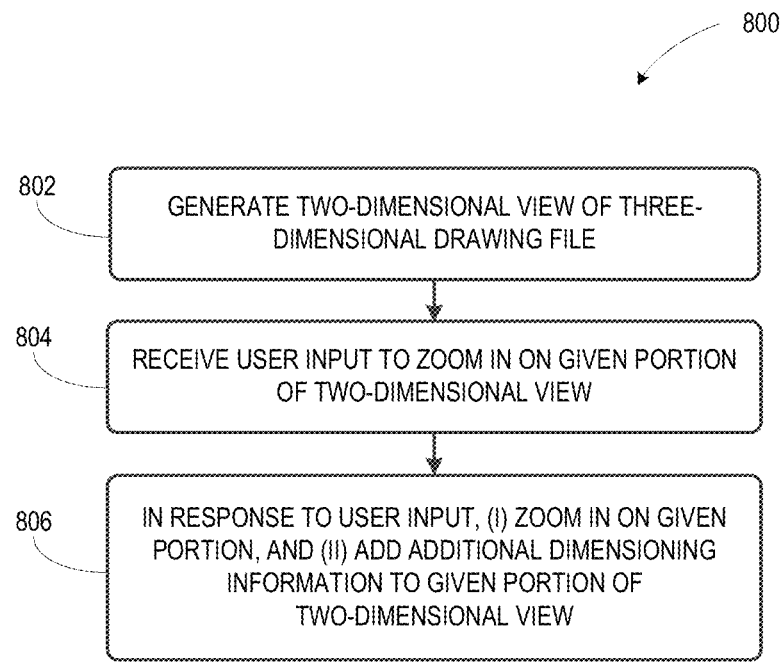
FIG. 8 depicts an example flow chart that may be carried out to facilitate dynamically displaying dimensioning information, in accordance with one embodiment of the present disclosure.
Figure 11:
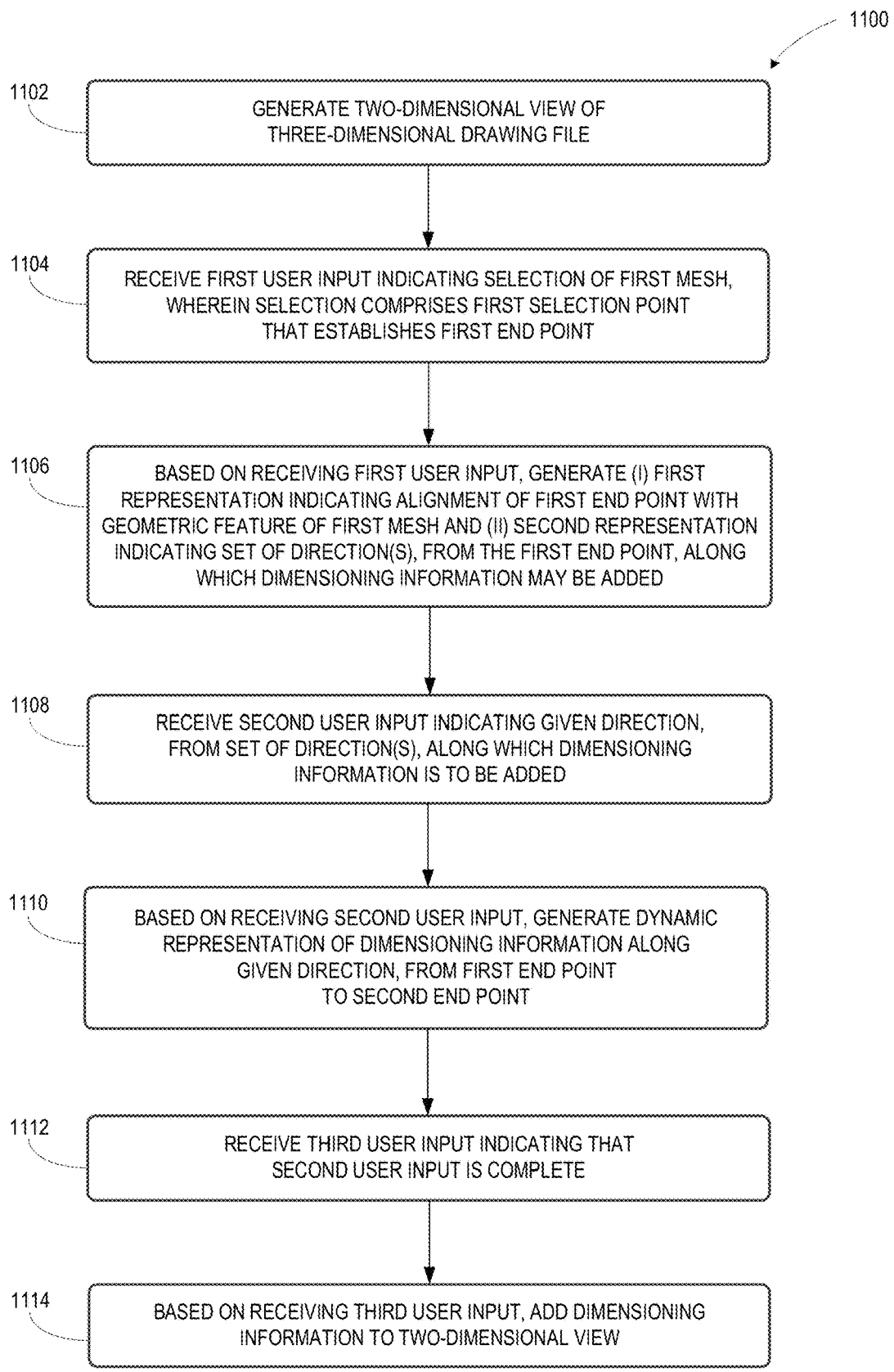
FIG. 11 depicts an example flow chart that may be carried out to facilitate dynamically displaying dimensioning information, in accordance with another embodiment of the present disclosure.

To help describe some of these operations, flow diagrams, such as the flow diagrams 500 of FIG. 5, 800 of FIG. 8, and 1100 of FIG. 11, may also be referenced to describe combinations of operations that may be performed by a computing device. In some cases, a block in any one of the flow diagrams may represent a module or portion of program code that includes instructions that are executable by a processor to implement specific logical functions or steps in a process. The program code may be stored on any type of computer-readable medium, such as non-transitory computer readable media (e.g., data storage 204 shown in FIG. 2). In other cases, a block in any one of the flow diagrams may represent circuitry that is wired to perform specific logical functions or steps in a process. Moreover, the blocks shown in each of the flow diagrams may be rearranged into different orders, combined into fewer blocks, separated into additional blocks, and/or removed, based upon the particular embodiment. Each flow diagram may also be modified to include additional blocks that represent other functionality that is described expressly or implicitly elsewhere herein.

A. Generating Two-Dimensional Views with Gridline Information

As noted above, in a first aspect, the disclosed software technology may cause a computing device to carry out a process for obtaining and converting gridline information from a two-dimensional drawing file and providing the gridline information and associated dimensioning information on a generated two-dimensional view of the three-dimensional drawing file. This process may take various forms.

With reference now to flow diagram 500 of FIG. 5, one example of a process carried out in accordance with the disclosed software technology for generating a two-dimensional view with gridline information is illustrated and described. In practice, this process may be commenced while the computing device is presenting a three-dimensional view via a GUI, such as the three-dimensional view shown in FIG. 4. In some implementations, for instance, the computing device may receive an indication that a user has requested creation of a two-dimensional view, such as through the push of a button or the selection of a menu command. However, other ways to commence the process are possible as well.

Once the process is commenced, the process may generally involve the following operations: (i) at block 502, the computing device may extract gridline information from a two-dimensional drawing file, (ii) at block 504, the computing device determines, for the gridline information, first coordinate information that is based on a first datum, (iii) at block 506, the computing device converts the first coordinate information into second coordinate information based on a second datum used by a three-dimensional drawing file, (iv) at block 508, the computing device receives a request to generate a two-dimensional view of the three-dimensional drawing file including an intersection of two meshes, (v) at block 510, the computing device generates the two-dimensional view, and (vi) at block 512, the computing device adds at least one gridline as well as dimensioning information involving the at least one gridline and at least one of the two meshes. Each of these operations will now be discussed in further detail.

At block 502, a computing device, such as the computing device 200 shown in FIG. 2, may extract gridline information from a two-dimensional drawing file. For example, the two-dimensional drawing file may be the drawing 300 shown in FIG. 3, and the gridline information may correspond to the gridlines 301. In some implementations, the drawing 300 may exist as a CAD drawing and the computing device 200 may extract the gridline information from the CAD drawing. Other possibilities also exist.

At block 504, the computing device 200 may determine, for the gridline information, first coordinate information that is based on a first datum. For instance, as discussed above, the first datum may include a horizontal datum such as latitude and longitude, and the first coordinate information may include a set of points expressed in degrees, minutes, and seconds, or in decimal degrees, among other examples. Accordingly, this coordinate information may define the horizontal gridlines 301 shown in FIG. 3.

Further, because the gridlines 301 shown in FIG. 3 may be used for each of the two-dimensional drawings corresponding to the construction project, e.g., two-dimensional drawings representing different floors of the building at different vertical elevations, the two-dimensional drawing 300 may also include vertical data corresponding to the gridlines 301. That is, although the gridlines 301 are depicted as horizontal lines in the x- and y-direction of the drawing 300, each of these gridlines 301 may include corresponding gridline information that defines a plane that extends vertically, in the z-direction, through the construction project.

In some examples, the two-dimensional drawing 300 may include gridline information defining a set of vertical gridlines at regular intervals, (e.g., every 12 feet), even though the vertical gridlines are not shown in the two-dimensional drawing 300. Thus, the computing device 200 may extract this vertical gridline information in conjunction with the horizontal gridline information. In some other implementations, the two-dimensional drawing 300 may include vertical elevation data that is based on the first datum, but the two-dimensional drawing 300 might not define any vertical gridlines based on the first datum. In this case, the computing device 200 may determine the first coordinate information for the vertical gridlines that is based on the first datum.

Depending on the format of the gridline information in the two-dimensional drawing 300, the computing device 200 may perform steps 502 and 504 substantially concurrently. For instance, the gridline information may be expressed in the two-dimensional drawing 300 using first coordinate information that is based on the first datum, and thus the computing device 200 may extract the gridline information as such. For instance, the two-dimensional drawing 300 may include both horizontal and vertical gridline information expressed by a set of GPS coordinates having x-, y-, and z-components. In other examples, as noted above where the two-dimensional drawing 300 does not include complete gridline information defining vertical gridlines, the computing device 200 may determine the first coordinate information for the vertical gridlines as noted above.

Extracting the gridline information as discussed above from a two-dimensional drawing file for the construction project may provide a quick and accurate way to obtain the gridline information that covers the metes and bounds of the construction project. However, because the gridline information in the two-dimensional drawing is based on universal coordinates, the gridline information might also be obtained by the computing device 200 from a database or other mapping source. For example, a known reference point, such as a roadway intersection or a GPS point within the construction project, may be used as a basis to determine first coordinate information in an area surrounding the construction project. The gridline information may then be determined therefrom.

At block 506, the computing device 200 converts the first coordinate information into second coordinate information that is based on a second datum. As noted previously, a three-dimensional drawing file corresponding to the construction project may be based on a second datum that is project specific, rather than the universal coordinates discussed above. For example, each mesh representing a physical component in the three-dimensional view depicted in FIG. 4 may have coordinates that are based on a project specific origin point, such as a building corner or other reference point. This origin point may be assigned coordinate values of (0, 0, 0) in the x-, y- and z-directions, for instance. Although this may simplify the layout and location of physical elements within the three-dimensional drawing, these coordinates might not be readily compatible with the universal coordinates on which the gridline information is based.

Thus, in order to make the gridline information compatible with the three-dimensional drawing, the computing device 200 may convert the first coordinate information into second coordinate information in a number of ways. For instance, the computing device 200 may map the first coordinate information to the second coordinate information based on a transformation function.

In some implementations, the transformation function may be predetermined. For example, during the design phase of the construction project, the location of one or more building corners, including the reference point used as the origin for the three-dimensional drawing, may be defined based on universal coordinates using the first coordinate system. This might be desirable, for example, to ensure that the building is properly located with respect to certain boundaries, such as property lines, setbacks, and/or floodplain elevations, which may themselves be derived from universal coordinates.

Based on this information, a function may be derived that allows any point in three-space that is defined based on the project-specific, second datum to be converted such that it is defined instead based on universal first datum, and vice versa. As one example, converting from the second datum to the first datum may involve adding the values (41.883 degrees, −87.623 degrees, 610 feet) to each set of (x, y, z) coordinates in three-space. Differences in latitude and longitude degrees can further be converted into feet, for instance, using known methods.

Conversely, the computing device 200 may perform the reverse operation when converting coordinate information from the first datum to the second, such as the gridline information discussed herein. For example, the computing device 200 may store in memory a conversion table or similar data structure that contains, for the gridline information, the corresponding first coordinate information and then the converted, second coordinate information. Other possibilities also exist.

In some implementations, the transformation function might not be predetermined based on known references to the first datum. In these scenarios, the first computing device 200 may derive the transformation function based on information within the two-dimensional and three-dimensional drawings. For instance, in conjunction with determining the first coordinate information for the gridline information, the computing device 200 may also determine first coordinate information for at least two reference points in the two-dimensional drawing file that have corresponding reference points in the three-dimensional drawing file. The reference points may be, for example, one or more building corners as discussed above, or another similarly identifiable reference point that is represented in both drawings. In some cases, the computing device 200 may automatically select the reference points. In other embodiments, the computing device 200 might prompt a user to indicate one or more of the reference points in the two-dimensional drawing and their corresponding reference points in the three-dimensional drawing.

Once the first coordinate information for the reference points in the two-dimensional drawing file is determined, the computing device 200 determines second coordinate information for the at least two corresponding reference points in the three-dimensional drawing file. The computing device 200 may determine the transformation function based on the first coordinate information and the second coordinate information.

In some implementations, the reference points may have associated elevation data that is already expressed in terms of the first datum, as noted above, requiring only a transformation function for the x- and y-coordinates between datums. Alternatively, the reference points might not have associated elevation information that is based on the first datum, but may nonetheless have relative elevation information inherently associated with them. For example, where the two reference points are selected as two corners of a building, they might both correspond to the same elevation representing the top of the building's foundation. Thus, they can be assumed to be in the same horizontal plane (i.e., they have the same z-coordinate value) for purposes of deriving the transformation function. In some other implementations, a third reference point may be used to establish the transformation function in the vertical as well as horizontal directions. Other examples also exist.

At block 508, the computing device 200 may receive a request to generate a two-dimensional view of the three-dimensional drawing file, where the two-dimensional view includes an intersection of two meshes within the three-dimensional drawing file. For example, returning to the example shown in FIG. 4 and discussed above, a construction professional may wish to generate a two-dimensional view that shows the intersection of the first pipe 402 and the second pipe 404 with the wall 406.

The construction professional may initiate the request for the specific two-dimensional view in a number of different ways. For example, the construction professional may make a selection indicating a command to generate a two-dimensional view, and then make a series of additional selections specifying, for example, a first mesh (e.g., the wall 406) along which the two-dimensional view will be created, a second mesh (e.g., the first pipe 402) that intersects the first mesh, a boundary or similar area surrounding the intersection for which the construction professional would like to view cross-sectional information, and so on. Additionally, or alternatively, the construction professional may manipulate the perspective of the three-dimensional view shown in FIG. 4 using the one or more of the controls 403, 405, or 407 and then request that a two-dimensional view be generated based on the then-current perspective shown in the snapshot 400. Other examples are also possible.

At block 510, the computing device 200 generates the two-dimensional view of the three-dimensional drawing file.

Figure 6A:
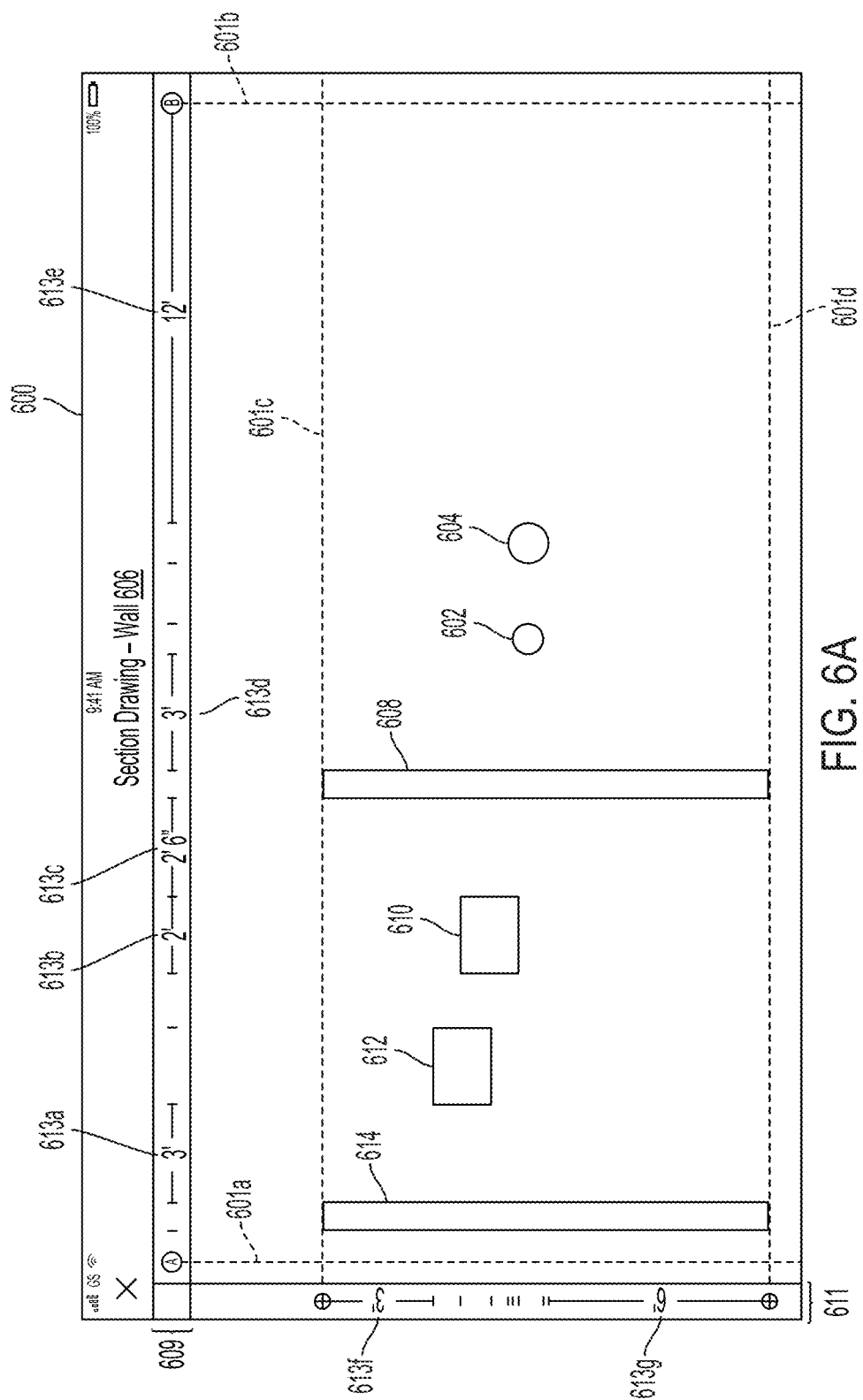
FIG. 6A depicts an example two-dimensional view of a three-dimensional drawing file, in accordance with one embodiment of the present disclosure.

FIG. 6A depicts one example of a two-dimensional view 600 of a three-dimensional drawing file, according to one possible implementation. The two-dimensional view shown in FIG. 6A may be generated, for instance, from a three-dimensional drawing file similar to the one shown in FIG. 4. For example, the two-dimensional view 600 may be a cross-sectional view taken through a given mesh in the three-dimensional drawing file that represents a wall 606. Accordingly, several other meshes that intersect the wall 606 are shown as two-dimensional shapes, such as a first pipe 602, a second pipe 604, a first column 608, a second column 614, a first air duct 610, and a second air duct 612.

At block 512, the computing device 200 may add to the generated two-dimensional view 600 at least one gridline corresponding to the gridline information. For example, FIG. 6A also depicts gridlines 601a, 601b, 601c, and 601d that correspond to the gridline information that was converted, as discussed above, so as to be compatible with the three-dimensional drawing file. The computing device 200 may also, at block 512, add to the generated two-dimensional view 600 dimensioning information involving the at least one gridline and at least one of the two intersecting meshes.

For example, the two-dimensional view 600 shown in FIG. 6A includes a horizontal dimensioning reference bar 609 located across the top of the view 600, and a vertical dimensioning reference bar 611 located along the left side of the view 600. Within the reference bars are included dimensions showing the distance between a given mesh and a gridline, as well as between individual meshes. For example, dimensions 613a, 613b, 613c, and 613d each indicate a horizontal distance between two of the meshes shown intersecting the wall 606. Dimension 613e indicates a horizontal distance between the pipe 604 and the gridline 601b. Similarly, dimensions 613f and 613g, shown in the reference bar

611, indicate the vertical distances from the gridlines 601*c* and 601*d* to the next nearest element in the two-dimensional view 600. As shown in FIG. 6A, both the horizontal reference bar 609 and the vertical reference bar 611 include additional tick marks corresponding to the locations of other elements shown in the two-dimensional view 600.

In some implementations, the computing device may automatically determine the dimensioning information to add to the two-dimensional view 600 based on various factors, such as the next nearest element to a given gridline or element, or the amount of space within the reference bar to legibly display the dimensioning information. However, in some situations this automatic dimensioning may not provide the construction professional with the specific information that is needed. For example, the construction professional may desire horizontal and vertical dimensioning information to locate the intersection of the pipe 602 with the wall 606, which is not immediately evident from the view 600.

Accordingly, after generating the two-dimensional view 600 of the three-dimensional drawing file, the computing device 200 may receive an input selecting, within the two-dimensional view, the intersection between the two meshes. For example, the construction professional may select the pipe 602 within the two-dimensional view 600.

Figure 6B:
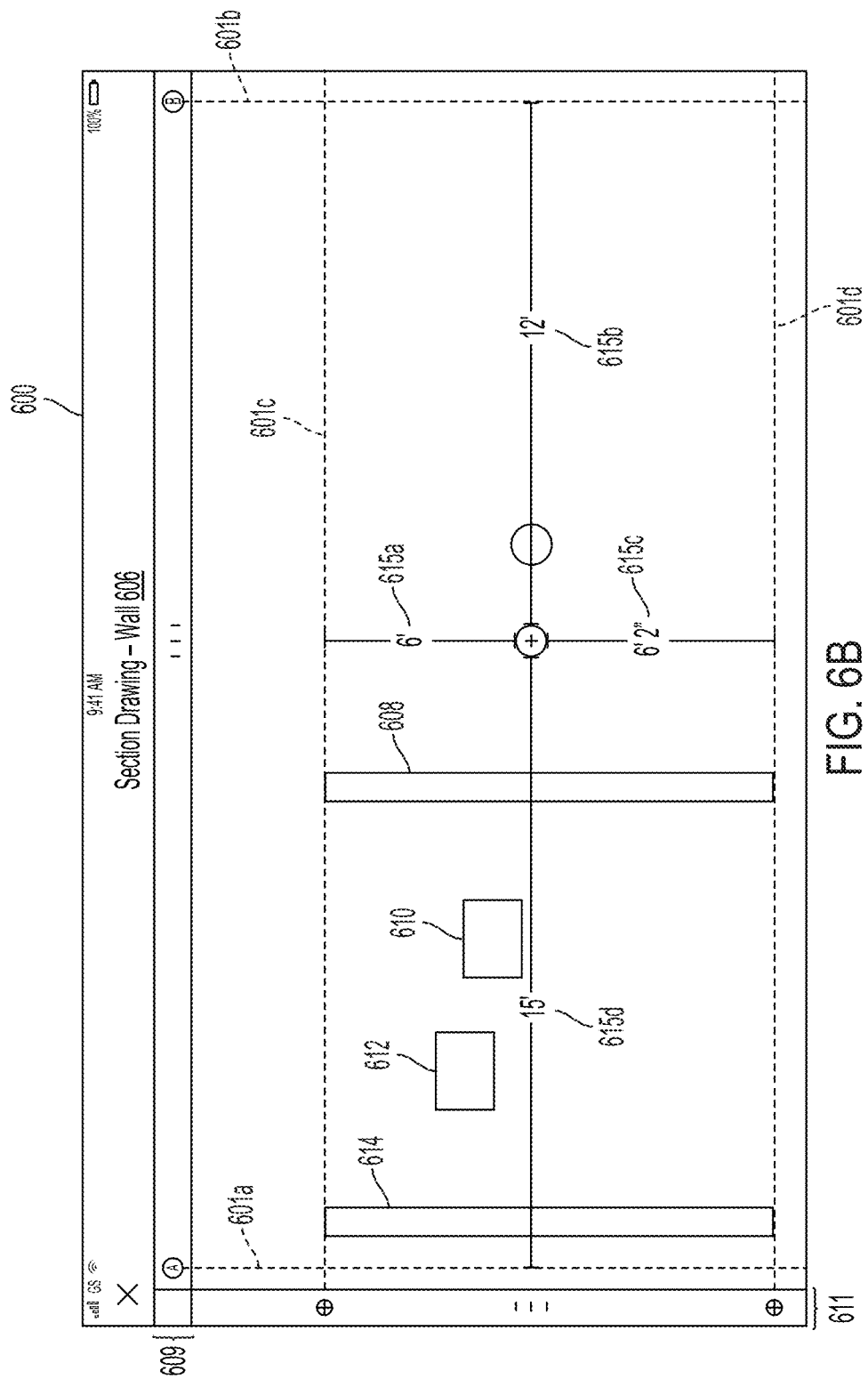
FIG. 6B depicts another example two-dimensional view of the three-dimensional drawing file shown in FIG. 6A.

FIG. 6B shows another example of the two-dimensional view 600 after being updated by the computing device 200 in response to the construction professional's input selecting the pipe 602. The view 600 now includes dimensions 615*a*, 615*b*, 615*c*, and 615*d* indicating the respective distances from the outer edge of pipe 602 to each of the four gridlines. Further, all dimensioning information referencing the other elements in the view 600 has been removed. After reviewing the information shown in FIG. 6B, the construction professional might select a different element, such as the air duct 610, and the dimensioning information may be updated accordingly, removing the dimensions related to the pipe 602 and instead showing the distances from the outer edge of air duct 610 to each of the gridlines.

In some cases, the construction professional may prefer to view dimensioning information pertaining to the centerline of an element rather than the edge of the element, or may prefer to toggle between the two depending on the current task. Accordingly, the computing device 200 may provide functionality that allows the user to toggle between the two types of measurements. For instance, after generating the two-dimensional view 600 shown in FIG. 6B, the computing device 200 may receive an input further selecting the intersection between the two meshes within the two-dimensional view. In particular, the construction professional may further select the pipe 602 within the two-dimensional view 600 shown in FIG. 6B.

Figure 6C:
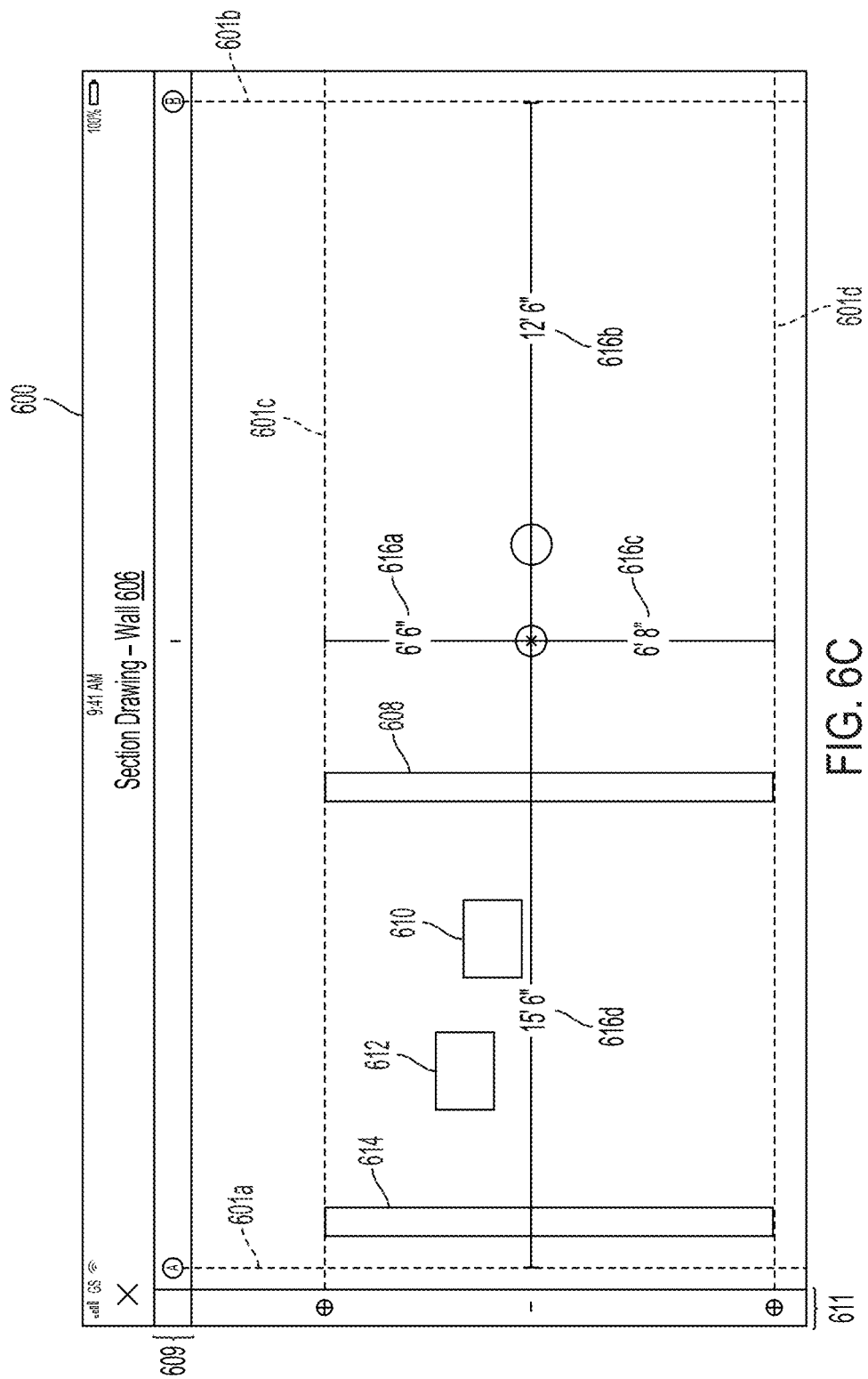
FIG. 6C depicts another example two-dimensional view of the three-dimensional drawing file shown in FIG. 6A.

In response, the computing device 200 may update the two-dimensional view 600 as shown in FIG. 6C. The updated view 600 now includes dimensions 616*a*, 616*b*, 616*c*, and 616*d* indicating the respective distances from the centerline of pipe 602 to each of the four gridlines, replacing the dimensions measured from the edge of pipe as shown in FIG. 6B. After reviewing the information shown in FIG. 6C, the construction professional might elect to toggle back to the edge-of-pipe measurements shown in FIG. 6B by again selecting the pipe 602 in the two-dimensional view 600. Similarly, the construction professional may select a different element, such as the air duct 610, to toggle between viewing dimensioning information from the edge of the duct or the centerline of the duct to each of the four gridlines, as described with reference to FIG. 6C. Other examples are also possible.

Figure 7A:
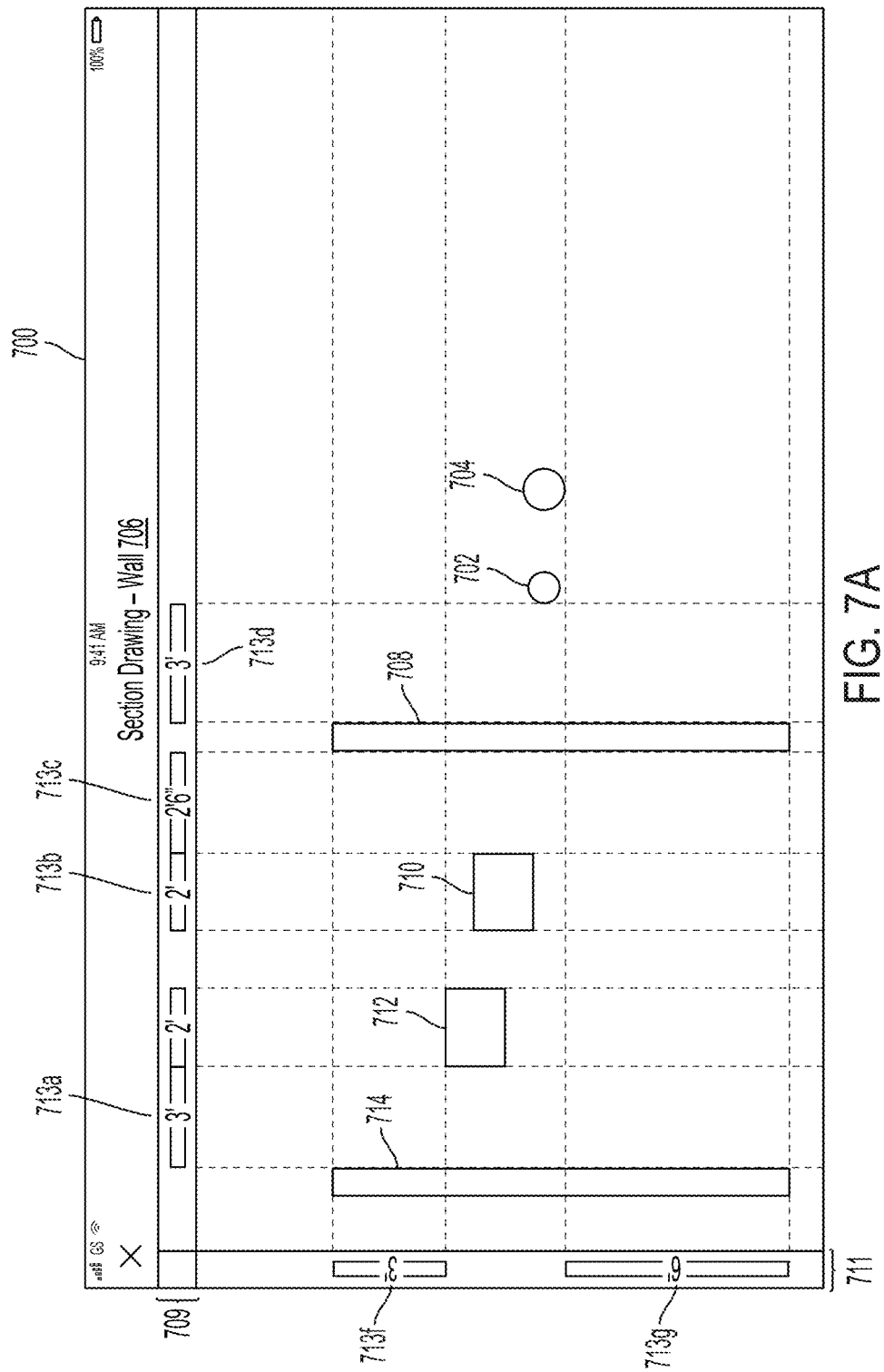
FIG. 7A depicts another example two-dimensional view of a three-dimensional drawing file, in accordance with one embodiment of the present disclosure.

FIG. 7A shows another example of a two-dimensional view 700 that the computing device 200 may generate from a three-dimensional drawing file. Similar to FIGS. 6A and 6B, the view 700 may be a cross-sectional view taken through a wall 706. As above, several meshes in the three-dimensional drawing may intersect the wall 706, including a first pipe 702 and a second pipe 704, columns 708 and 714, and air ducts 710 and 712. A horizontal dimensioning reference bar 709 is located across the top of the view 700 and a vertical dimensioning reference bar 711 located along the left side of the view 700. The reference bars contain dimensioning information 713*a*, 713*b*, 713*c*, 713*d*, 713*f*, and 713*g*, which indicate distance between respective elements that are shown in the view 700. Accompanying these dimensions are respective horizontal and vertical reference lines, which may facilitate the visualization of the distances between elements.

Unlike the example view 600 shown in FIG. 6A, the view 700 does not include gridline information, and therefore also does not include dimensioning information involving the gridlines. For example, it may be desirable for the computing device 200 to avoid using the processing and storage resources required to add the gridline information to a given two-dimensional view until the gridline information is specifically requested by a user. In fact, in some implementations, the computing device 200 might not undertake any of the steps discussed above related to obtaining the gridline information-including extracting the gridline information from a two-dimensional drawing, determining the coordinate information, and converting it to a compatible datum, etc.—until a two-dimensional view has already been generated and the computing device 200 receives an input indicating that the gridline information should be added to the two-dimensional view.

Figure 7B:
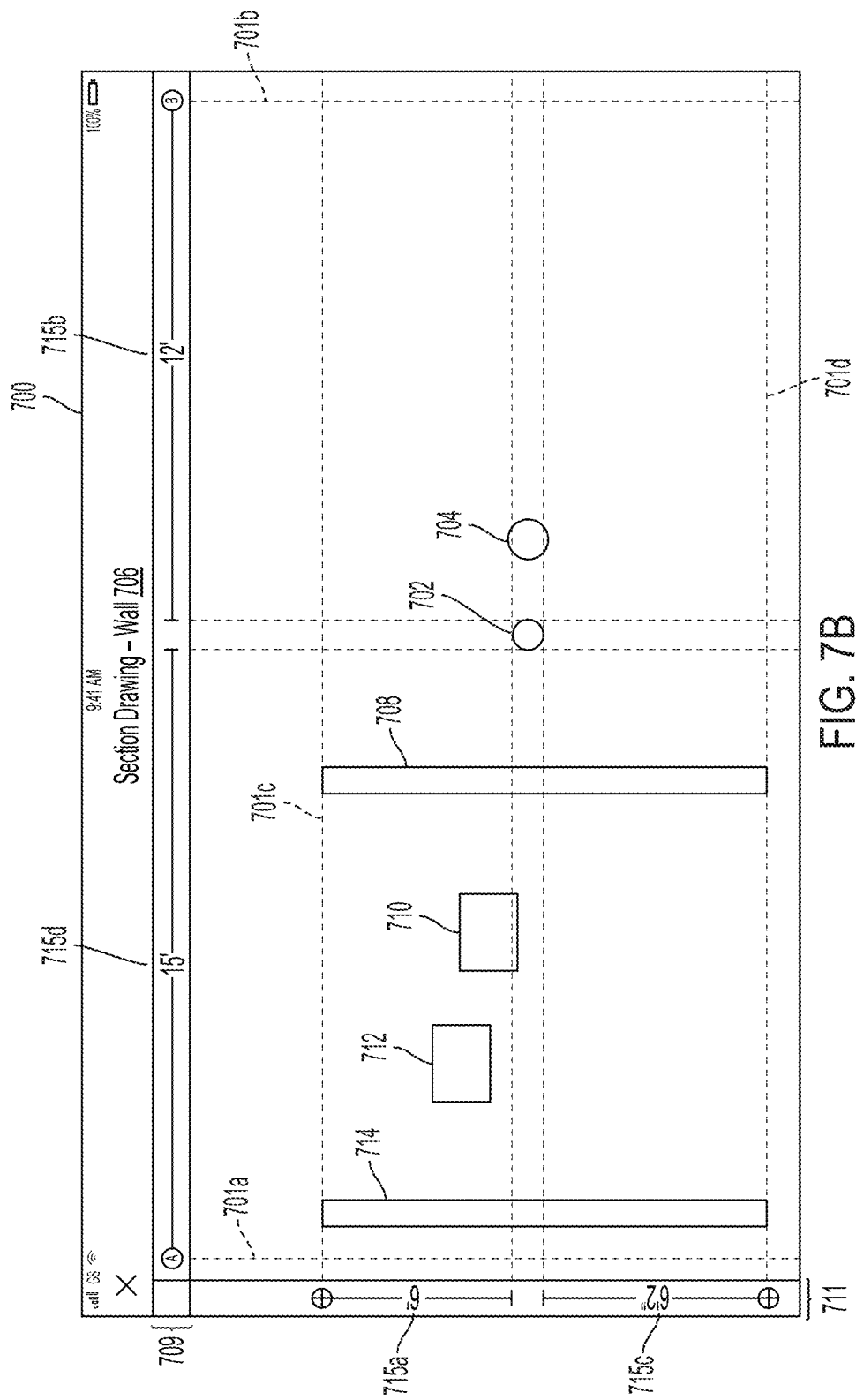
FIG. 7B depicts another example two-dimensional view of the three-dimensional drawing file shown in FIG. 7A.

FIG. 7B shows the two-dimensional view 700 after being updated by the computing device 200 in response to the construction professional's input selecting the pipe 702. The gridlines 701*a*, 701*b*, 701*c*, and 701*d* have been added. Further, and similar to FIG. 6B, dimensions 715*a*, 715*b*, 715*c*, and 715*d* have been added to the view 700 indicating the respective distances from the pipe 702 to each of the four gridlines, replacing all of the dimensioning information related to the other elements shown in view 700. Further, additional horizontal and vertical reference lines accompany the newly added dimensioning information, similar to FIG. 7A. As discussed above, the construction professional may select a different element shown in the view 700, which may cause the computing device 200 to update the displayed dimensioning information accordingly.

In the examples discussed above, the computing device 200 adds the gridline information and associated dimensioning information to the two-dimensional view after the two-dimensional view is generated, or at the time it is generated. However, in some alternate examples, the gridline information might be inserted into the three-dimensional view such that the gridlines are visible in the snapshot 400 shown in FIG. 4. Thus, the gridlines may be displayed in the three-dimensional view before the computing device 200 receives a request to generate a two-dimensional view therefrom, as discussed above. Numerous other examples are also possible.

B. Dynamic Display of Dimensioning Information

In a second aspect, the disclosed software technology may cause a computing device to carry out a process for dynamically updating dimensioning information based on a repositioning of a two-dimensional view by a user. As mentioned above, the two-dimensional view generated by the computing device 200 according to the examples discussed herein might not have the space to legibly display all of the dimensioning information that the construction professional is interested in. Therefore, the computing device 200 may dynamically update the two-dimensional view and dimensioning information therein based on certain inputs from the construction professional.

With reference now to flow diagram 800 of FIG. 8, one example of a process carried out in accordance with the disclosed software technology for dynamically displaying dimensioning information is illustrated and described. In practice, this process may be commenced in connection with the generation of a two-dimensional view according to the process and examples discussed above. However, other ways to commence the process are possible as well.

Once the process is commenced, the process may generally involve the following operations: (i) at block 802, the computing device generates a two-dimensional view of a three-dimensional drawing file, (ii) at block 804, the computing device may receive a user input to zoom in on a given portion of the two-dimensional view, and (iii) at block 806, the computing device, in response to the user input, zooms in on the given portion of the two-dimensional view and adds additional dimensioning information corresponding to one or more meshes displayed in the given portion of the two-dimensional view. Each of these operations will now be discussed in further detail.

Figure 9A:
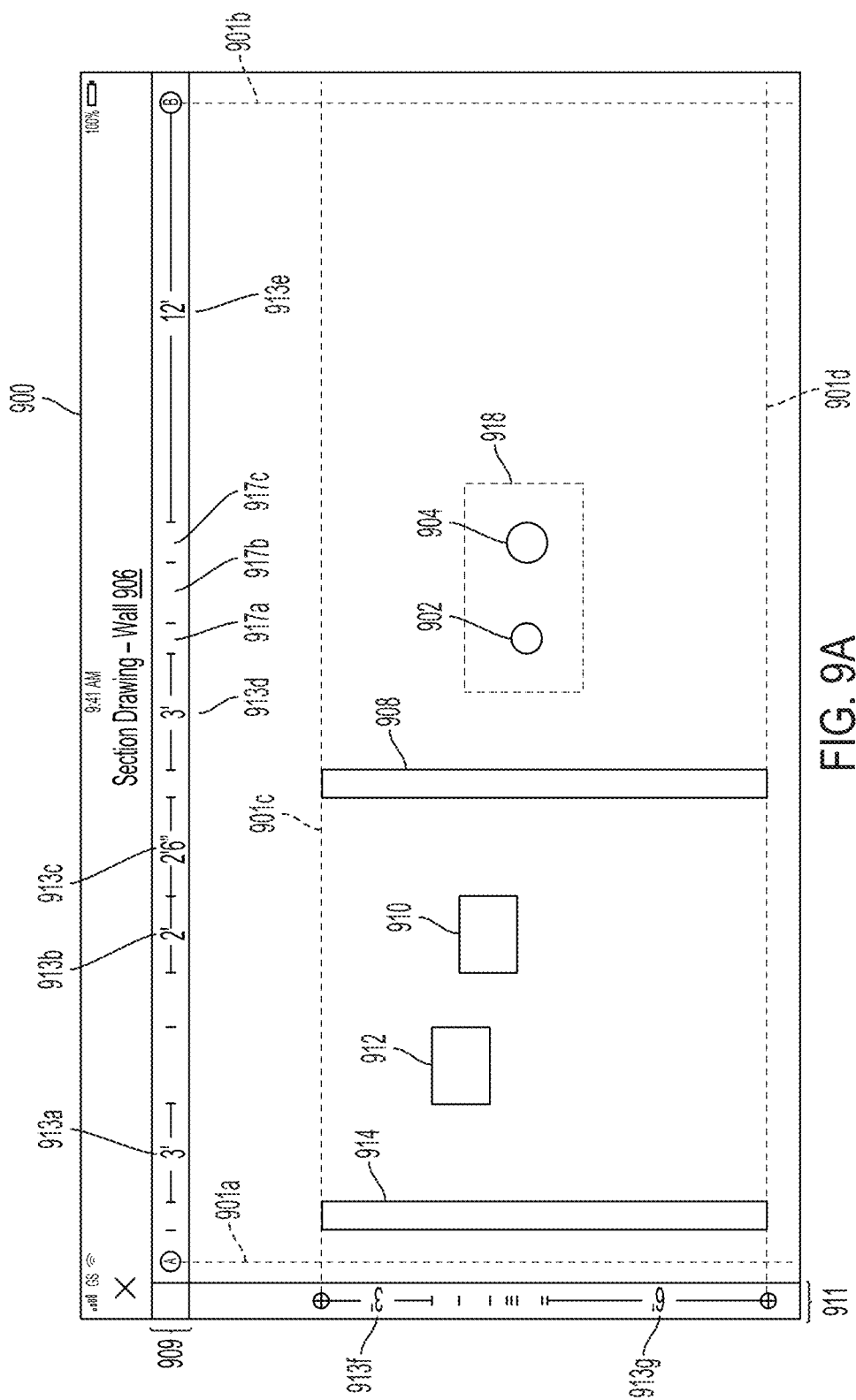
FIG. 9A depicts an example two-dimensional view of a three-dimensional drawing file, in accordance with one embodiment of the present disclosure.

At block 802, the computing device 200 may generate a two-dimensional view of a three-dimensional drawing file, as discussed generally above. For instance, FIG. 9A shows an example two-dimensional view 900 that may be generated according to the examples discussed above. Similar to FIG. 6A, the view 900 may be a cross-sectional view taken through a wall 906, showing the wall's intersection with a first pipe 902, a second pipe 904, columns 908 and 914, and air ducts 910 and 912, among other elements of the construction project. Gridlines 901*a*, 901*b*, 901*c* and 901*d* are also shown in the view 900. In some other implementations, as discussed above, the computing device 200 might not add the gridline information to the two-dimensional view 900 unless an input is received requesting this information.

Like in FIG. 6A, dimensions 913*a*, 913*b*, 913*c*, 913*d*, and 913*e* are shown along a horizontal dimensioning reference bar 909 shown along the top of the view 900. Dimensions 913*f* and 913*g* are shown along the left side of the view 900 in a vertical dimensioning reference bar 911. However, the reference bar 909 also includes gaps 917*a*, 917*b*, and 917*c* between the tick marks corresponding to the first pipe 902 and the second pipe 904. Similar gaps are shown along the vertical reference bar 911, corresponding to the various elements shown in the view 900. These gaps might otherwise display dimensioning information, but for the lack of space to legibly display the information. Yet, the construction professional may be interested in these dimensions corresponding to the first pipe 902 and the second pipe 904.

Accordingly, the construction professional might provide an input to zoom in on a given portion of the two-dimensional view 900 in order to obtain more detail. For example, FIG. 9A shows a box 918 indicating a given portion of the two-dimension that the construction professional would like to focus on. The input to zoom in on the given portion 918 may be provided by any number of known methods, such as a pinch-to-zoom functionality enabled by a touchscreen display, a zoom window defined by mouse or other input device, among numerous other possibilities.

Thus, at block 804, the computing device 200 receives an input to zoom in on the given portion 918 of the two-dimensional view 900. At block 806, in response to the input, the computing device 200 may update the two-dimensional view 900 to zoom in on the given portion 918 and add additional dimensioning information to the given portion 918 of the two-dimensional view 900.

Figure 9B:
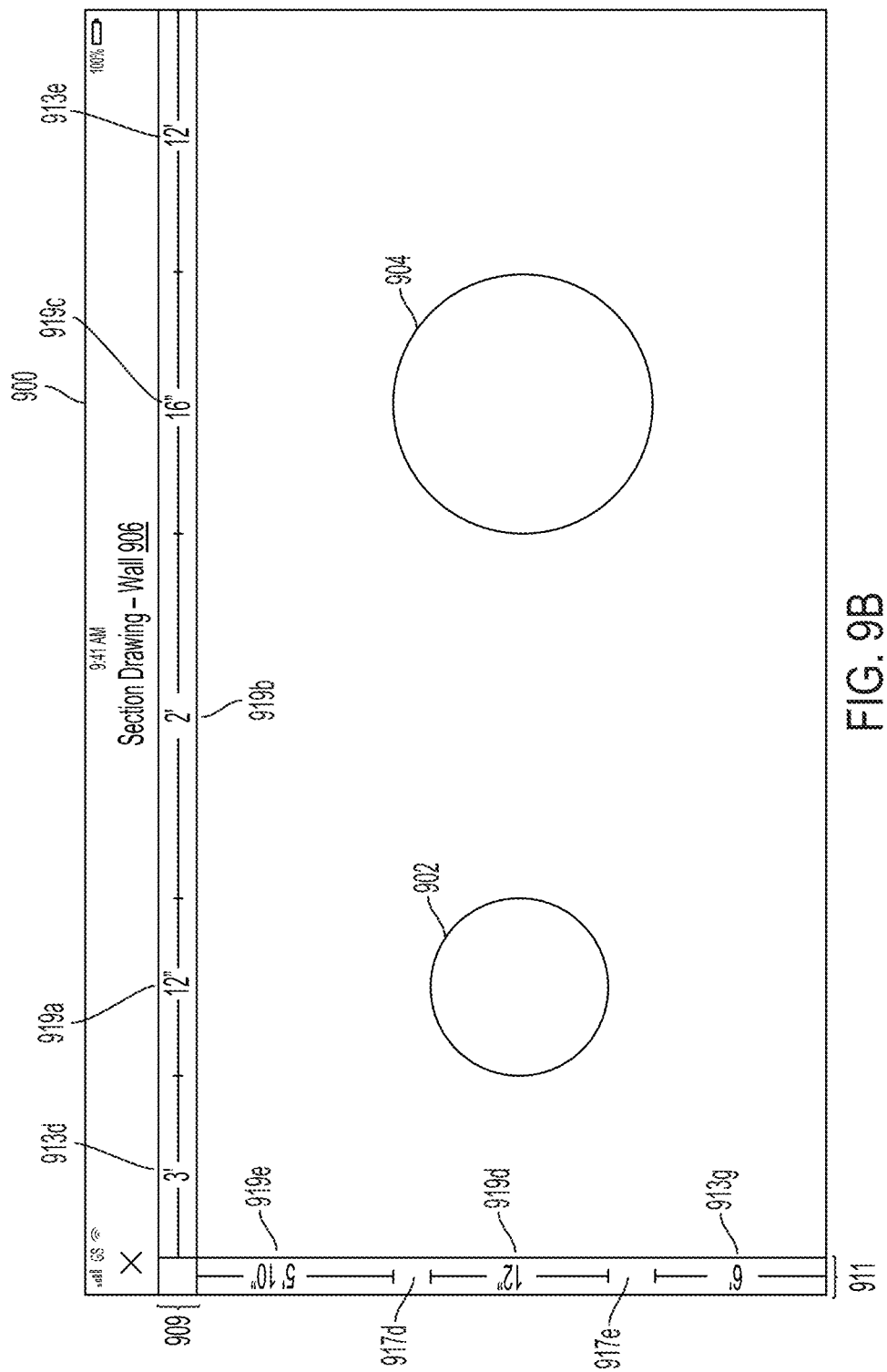
FIG. 9B depicts an example two-dimensional, zoomed-in view of the three-dimensional drawing file shown in FIG. 9A.

For example, FIG. 9B shows the updated view 900, now zoomed-in on the given portion 918. The computing device 200 has added additional dimensions 919*a*, 919*b*, and 919*c* to the reference bar 909, corresponding to the first pipe 902 and the second pipe 904, where formerly gaps were present. Similarly, additional dimensions 919*d* and 919*e* have been added to the vertical reference bar 911. Moreover, some of the initial dimensioning information shown in FIG. 9A but not included in the given portion 918, such as dimensions 913*a* and 913*b*, has been removed from the view 900. Likewise, comparing the vertical reference bar 911 between FIGS. 9A and 9B, it can be seen that some of the additional tick marks corresponding to other elements in the three-dimensional drawing have been removed from the view 900 as well, where those elements no longer appear in the view 900.

In some implementations, as shown in FIG. 9B, dimensions that extend beyond the edge of the view 900 after zooming in on the given portion 918 may nonetheless continue to be displayed, even though one of the end points for the dimensioning information is no longer shown. For example, the dimension 913*e* shown in FIG. 9A is still shown in FIG. 9B, even though the gridline 901*b* that marks the end of the dimension is no longer shown in the view 900. This may be desirable in some situations where a construction professional needs to continue zoom in on the view 900 to obtain the dimensioning information needed, while still maintaining a dimensional reference to the next nearest reference point that was shown in the initial two-dimensional view 900, shown in FIG. 9A.

Although the updated view 900 has been zoomed in on the given portion 918 indicated by the construction professional, the view 900 may still include some gaps where there is not enough space to legibly display relevant dimensioning information, as shown by the gaps 917*d* and 917*e* in the vertical reference bar 911. If these dimensions are needed, the construction professional may provide further input that causes the computing device 200 to continue zooming in on the view 900, until additional dimensions appear in place of the gaps 917*d* and 917*c*.

In this regard, the computing device 200 may facilitate the continuous readjustment of the view 900 by the construction professional, with corresponding updates to the view 900 and the dimensioning information that are also continuous, or substantially continuous. For example, the construction professional may utilize a pinch-to-zoom functionality on a touchscreen display, which may provide for progressive, substantially smooth updates to the zoom level of the view 900, both in and out, depending on how the construction professional moves his or her fingers. Accordingly, the computing device 200 may dynamically update the dimensioning information shown in the view 900 in a similarly progressive fashion, based on the changes in zoom level. This may allow a construction professional to zoom progressively on a given area until the desired dimensions appear along the horizontal reference bar 909, in place of a gap. Thus, the construction professional may zoom in only as far as necessary, while maintaining as much surrounding dimensioning information as possible.

Although the example above discusses a change in zoom level to the two-dimensional view 900, other updates to the view 900 are also possible. For example, the construction professional may provide inputs to pan the two-dimensional view 900 left, right, up, or down to view adjacent areas. The computing device 200 may update the view 900 accordingly, with corresponding updates to the dimensioning information, as discussed above.

The computing device 200 may facilitate the adjustment of a given two-dimensional view in various other ways as well. For instance, the view 900 shown in FIG. 9A may represent a cross-sectional, elevation view of the wall 906 at a given depth within the wall, such as the inside face of the wall 906. However, each element that intersects the wall 906 might have a cross-section that changes across the depth of the wall 906. Accordingly, a cross-sectional view from deeper within the wall, such as at the centerline of the wall, may reflect changes in the shape of one or more elements as compared to the view 900 shown in FIG. 9A, or may reflect additional elements within the wall 906 that are not shown in FIG. 9A. Further, elements that are shown in the view 900 of FIG. 9A may not be present at other locations within the wall 906. Similarly, a cross-sectional view from the outside face of the wall 906 may include additional elements such as flanges, trim (e.g., around a doorway), and the like that are not shown in FIG. 9A, but which may be present as meshes within the three-dimensional drawing file.

Figure 10A:
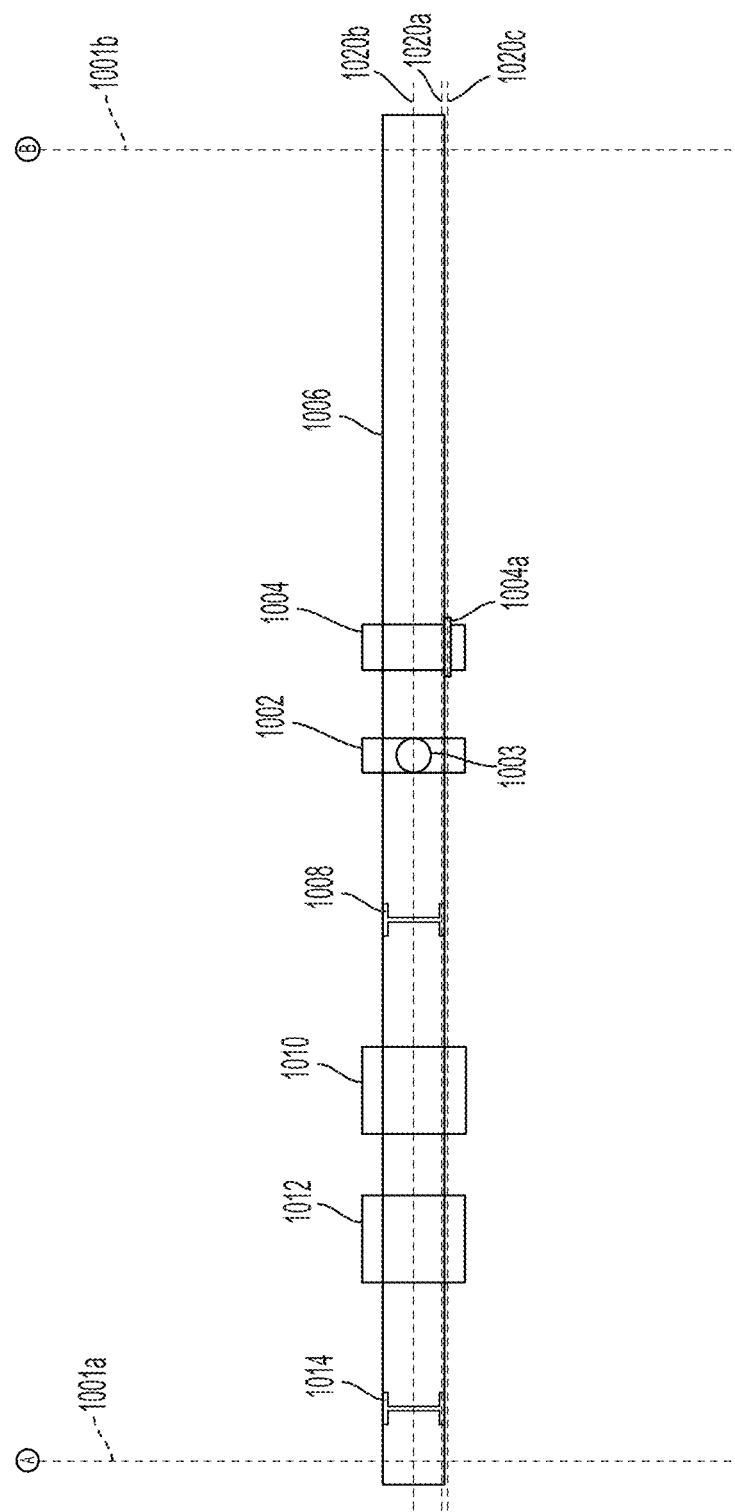
FIG. 10A depicts an example two-dimensional plan view of a three-dimensional drawing file, in accordance with one embodiment of the present disclosure.

As one possible illustration, FIG. 10A depicts a plan view of an example wall 1006, which may be similar to the example wall 906 shown in FIG. 9A. This plan view depicts wall 1006 from a top-down perspective, showing all of the elements that intersect with the wall 1006, including intersections with a first pipe 1002, a second pipe 1004, columns 1008 and 1014, and air ducts 1010 and 1012. Further, gridlines 1001*a* and 1001*b* are shown, which may correspond to the gridlines 901*a* and 901*b* shown in FIG. 9A.

As can be seen in FIG. 10A, several of the elements that intersect the wall 1006 have a cross-section that varies over the depth of the wall 1006. For example, columns 1008 and 1014 may be I-beams having cross-sections that vary (e.g., between the flanges and the web of the I-beams) across the depth of wall 1006. Furthermore, pipe 1002 may intersect with a vertically oriented pipe 1003 within the wall 1006. Additionally, pipe 1004 may include a flange 1004*a* which is positioned against the outside face of wall 1006. Accordingly, a single cross-sectional view from the inside face of wall 1006 may not capture the elements and variations noted above. As shown in FIG. 10A, cross-section lines 1020*a*, 1020*b*, and 1020*c* represent three examples of alternative cross-sectional views of wall 1006, each of which will be discussed in further detail below.

Cross-section line 1020*a* corresponds to a cross-sectional view from the inside face of wall 1006, which may generally correspond to the two-dimensional view 900 of wall 906 shown in FIG. 9A. As shown in FIG. 10A, cross-section line 1020*a* is located at the inside face of wall 1006 and intersects pipe 1004, pipe 1002, a flange of I-beam column 1008, air duct 1010, air duct 1012, and a flange of I-beam column 1014. However, the two-dimensional view corresponding to cross-section line 1020*a* may not reflect the vertically oriented pipe 1003, nor the webs for I-beam columns 1008 and 1014. A construction professional may desire to view such elements and their respective cross-sections at different locations across the depth of wall 1006. Accordingly, the computing device 200 may provide additional functionality allowing the construction professional to update a given two-dimensional view by selecting and adjusting the location of the cross-section line (e.g., by adjusting the depth of the cross-section line within a given wall) on which the two-dimensional view is based.

Figure 10B:
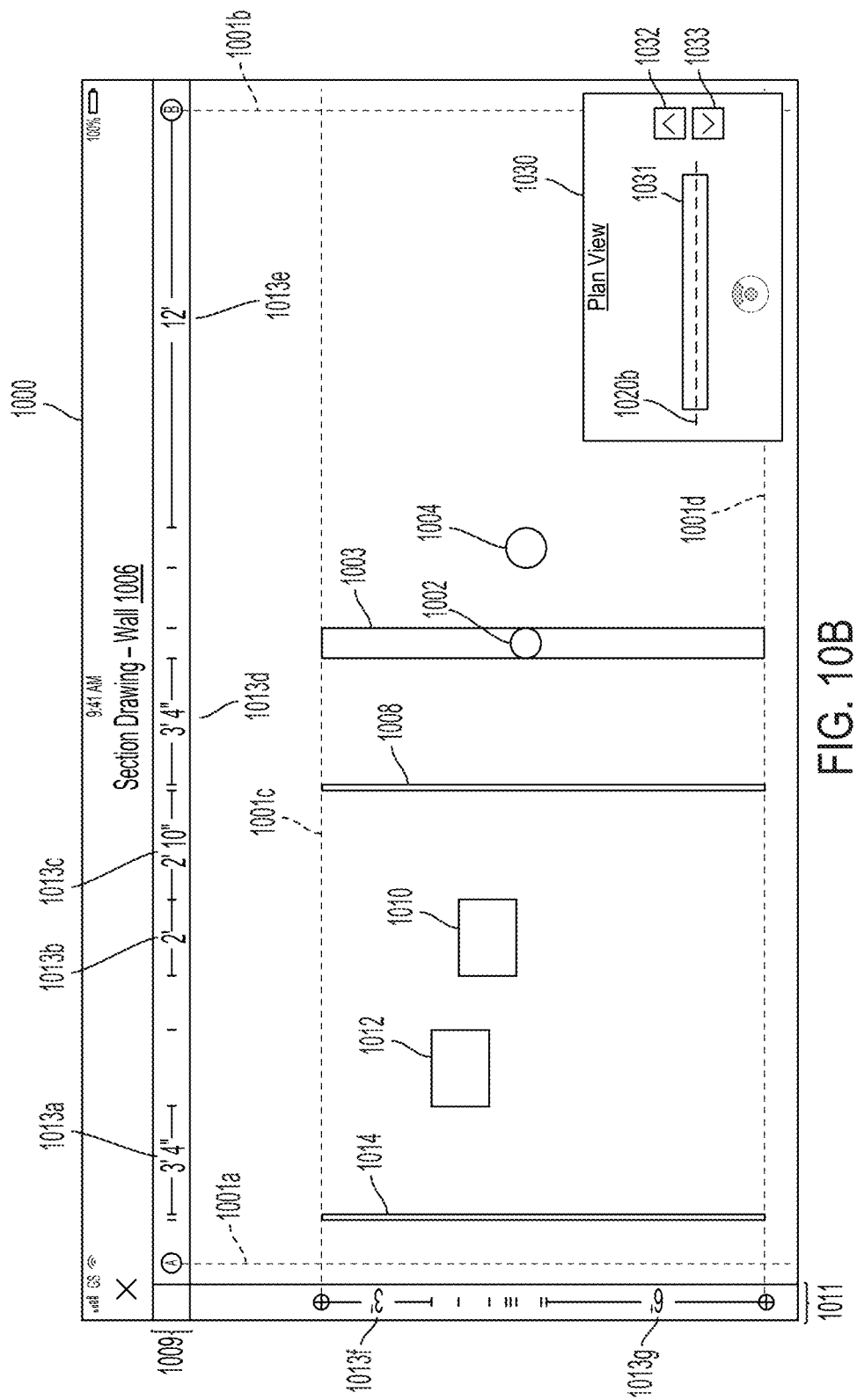
FIG. 10B depicts an example two-dimensional elevation view of the three-dimensional drawing file shown in FIG. 10A.

As a first example of an alternative cross-sectional view, FIG. 10B depicts a two-dimensional view 1000 that is based on the cross-section line 1020*b*, located at the centerline of the wall 1006. The two-dimensional view 1000 shown in FIG. 10B has notable differences from the two-dimensional view based on cross-sectional line 1020*a*, which may generally correspond to the two-dimensional view of wall 906 shown in FIG. 9A. One difference is that columns 1008 and 1014 appear much thinner, as this view reflects the webs of columns 1008 and 1014. Because columns 1008 and 1014 are I-beams, the columns are thinner at the webs than at the flanges, and therefore dimensioning information related to the columns 1008 and 1014 changes based on the location the cross-section line. Another difference is that vertically oriented pipe 1003 is now visible in view 1000, as it intersects wall 1006 at the centerline of wall 1006.

Furthermore, the computing device 200 has dynamically updated the dimensioning information depicted in view 1000, adding dimensions 1013*a*, 1013*b*, 1013*c*, 1013*d*, and 1013*c* to the reference bar 1009, corresponding to the column 1014, air ducts 1012 and 1010, column 1008, pipe 1002, vertical pipe 1003, and pipe 1004. Similarly, vertical dimensioning information 1013*f* and 1013*g* have been added to reference bar 1011. As can be seen in FIG. 10B, reference bars 1009 and 1011 further include tick marks showing distance gaps corresponding to the edges of various elements shown in the view 1000. These gaps might otherwise display dimensioning information, but for the lack of space to legibly display the information in the current view. As noted in the examples above, the construction professional may zoom in on a portion of the view 1000 to obtain any desired dimensioning information.

Gridlines 1001*a*, 1001*b*, 1001*c* and 1001*d* are also shown in the view 1000, which may provide a basis for some of the dimensioning information noted above. In some other implementations, as discussed above, the computing device 200 might not add the gridline information to the two-dimensional view 1000 unless an input is received requesting this information.

FIG. 10B also shows a cross-section adjustment tool 1030, which may be a window or similar interface element that is overlaid on, or otherwise incorporated into, the two-dimensional view 1000. The cross-section adjustment tool 1030 may include various components. One component of the cross-section adjustment tool 1030 is a plan view representation 1031 of the wall 1006. In some embodiments, the representation 1031 of the wall 1006 may be an approximation due to constraints on screen space and/or image resolution. Such an embodiment is shown in FIG. 10B, where the representation 1031 of the wall 1006 is a representative rectangular shape. In other embodiments, the representation 1031 of the wall 1006 may include a more detailed reproduction of the wall 1006, which may resemble the view shown in FIG. 10A. In still further embodiments, the representation 1031 may be adjustable by the construction professional. For instance, the representation 1030 may be reoriented to show a perspective view, rather than a plan view as shown in FIG. 10B. Other examples are also possible.

Another component of the cross-section adjustment tool 1030 is an indication of the cross-section line 1020*b* on which the view 1000 is based. As shown in FIG. 10B, the location of the cross-section line 1020b relative to the representation 1031 of the wall 1006 may indicate to a construction professional the location of the cross-section within the wall 1006 that is currently being depicted in the view 1000.

Additionally, the cross-section adjustment tool 1030 includes two controls: a first control 1032, represented by an up arrow, and a second control 1033, represented by a down arrow. These controls may allow the construction professional to adjust the view 1000 by moving, or "nudging," the location of the cross-section line within the wall 1006. For example, the construction professional may select the first control 1032 to increase the depth level of the view within the wall or the second control 1033 to decrease the depth level of the view within the wall. Accordingly, the construction professional may have adjusted the location of the cross-section line 1020a in FIG. 10A by progressively selecting the first control 1032 within the cross-section adjustment tool 1030 to increase the depth level of the view inside wall 1006, thereby moving the cross-section line 1020a from the inside face of the wall 1006 until it reached the location shown by cross-section line 1020b in FIG. 10B.

In this regard, the two-dimensional view 1000 may be updated continuously, or substantially continuously, as the construction professional adjusts the location of the cross-section line. The updates to the view 1000 may take various forms. For example, both the shape of the elements and the dimensions between the elements and/or the gridlines may be progressively updated in the view 1000 based on the construction professional's selection of the controls.

Figure 10C:
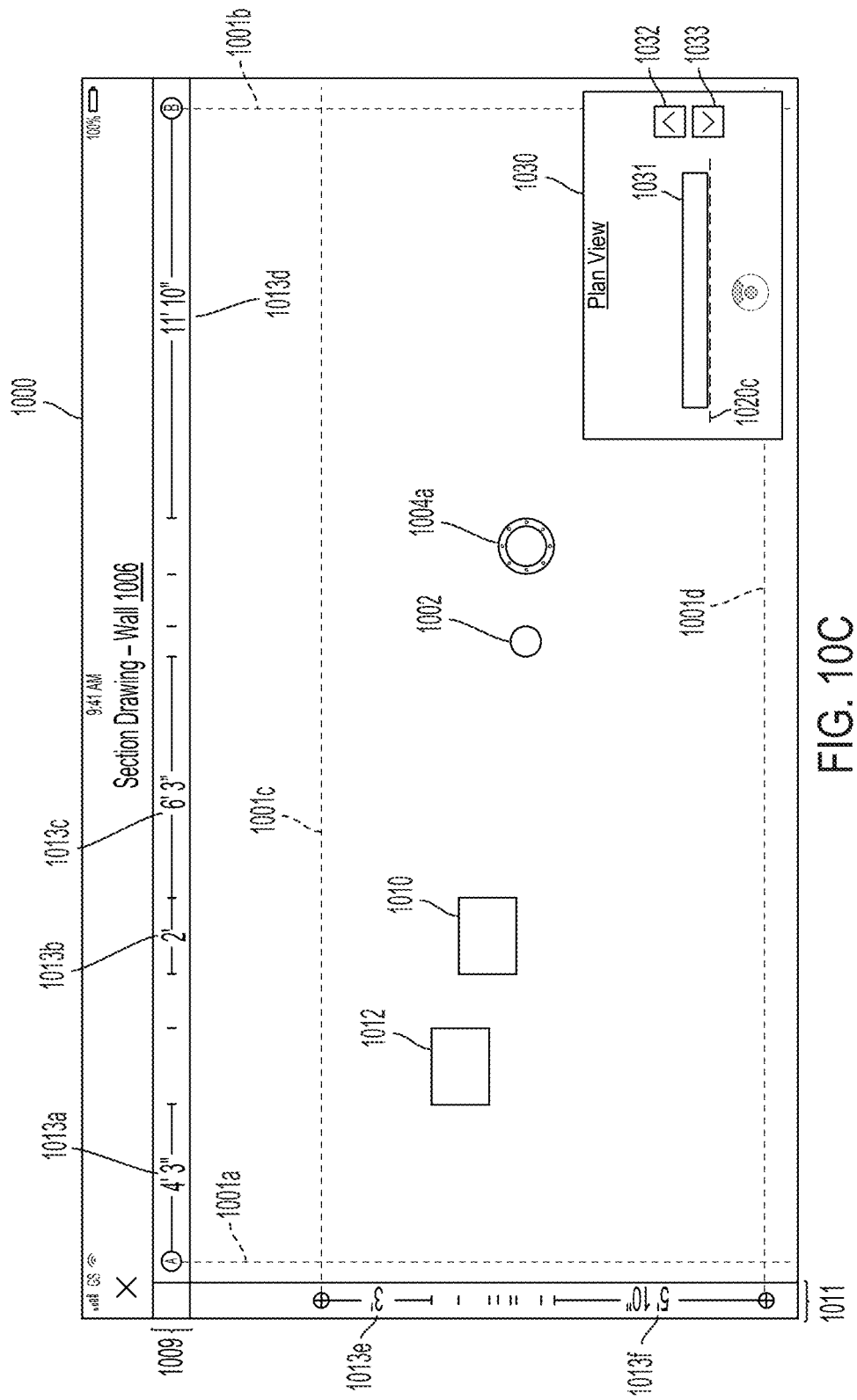
FIG. 10C depicts another example two-dimensional elevation view of the three-dimensional drawing file shown in FIG. 10A.

Turning to FIG. 10C, a second example of an alternative cross-sectional view related to wall 1006 is shown. In particular, FIG. 10C depicts an updated two-dimensional view 1000 that is based on cross-section line 1020c, located at the outside face of the wall 1006. The cross-section adjustment tool 1030 is also shown, which the construction professional may have used (e.g., by selecting control 1033) to adjust the location of the cross-section line and decrease the depth level of the view in relation to the wall 1006, as noted above. As shown in FIG. 10C, the location of cross-section line 1020c in relation to the representation 1031 of the wall 1006 within the cross-section adjustment tool 1030 reflects the outside face of the wall 1006.

The updated two-dimensional view 1000 shown in FIG. 10C has notable differences from the two-dimensional view that was based on cross-section line 1020b shown in FIG. 10B. One difference is that the columns 1008 and 1014 and the vertically oriented pipe 1003 are no longer visible, as they are positioned entirely within the wall 1006 and do not protrude outside the face of the wall 1006. Furthermore, the flange 1004a of pipe 1004 is now visible, as it protrudes from the outside face of the wall 1006. Additionally, dimensions 1013a, 1013b, 1013c, and 1013d in reference bars 1009 and 1011 have been updated to omit dimensioning information for the columns 1008 and 1014 and to include dimensioning information for the flange 1004a.

In some implementations, a given wall that is selected by a construction professional within a three-dimensional drawing file may have one or more relatively large dimensions (e.g., its width, height, or both), such that a cross-sectional view of the wall cannot be clearly displayed in a single, two-dimensional view. For instance, a cross-sectional view of a selected wall that is several stories tall may be too large to be used effectively. In these instances, the computing device 200 may determine a boundary for a generated two-dimensional view based on various criteria. As one example, the criteria may include determining a boundary based on a maximum height or width. Thus, if a construction professional requests a cross-sectional view of a given wall that exceeds the maximum height or width, the computing device 200 may generate a cross-sectional view that bounds the view at the maximum values. As another example, the computing device 200 may identify one or more gridlines near the construction professional's selection and use the one or more gridlines as boundaries. For instance, the computing device 200 may identify the nearest vertical gridline both above and below the construction professional's selection, such as gridlines 1001c and 1001d shown in FIG. 10B, to isolate a given level of a building. The computing device 200 may determine boundaries for a given cross-sectional view in various other manners as well.

Although the examples discussed above with respect to FIGS. 6A-10C involve cross-sectional views through walls and dimensioning information from gridlines, the cross-section adjustment tool 1030 may be used for various other applications as well.

The example views and associated dimensioning information discussed above with respect to FIGS. 6A-10C may be updated in various other ways as well. For example, certain meshes within a three-dimensional drawing may be hidden or shown based on a construction professional's preference. For instance, the construction professional may hide, or turn off, all elements related to HVAC sub-systems, which might cause the computing device 200 to remove the air ducts from the views shown in the examples above. In response, the computing device 200 might also update the dimensioning information shown in the views by removing any dimensions corresponding to the air ducts. Numerous other examples are also possible.

C. Dynamic Dimensioning Indicators

In some instances, it may be desirable to view additional dimensioning information corresponding to one or more specified meshes in the given portion of the two-dimensional view. For instance, a construction professional may wish to view dimensioning information between a first given mesh and a second given mesh, a given gridline, and/or a given point in the given portion of the two-dimensional view. Therefore, as noted above, in a third aspect, the disclosed software technology may cause a computing device to carry out a process for providing and dynamically updating dimensioning indicators and adding dimensioning information to a generated two-dimensional view of a three-dimensional drawing file based on receiving one or more user inputs. This process may take various forms.

With reference now to flow diagram 1100 of FIG. 11, one example of a process carried out in accordance with the disclosed software technology for adding dimensioning information to a generated two-dimensional view is illustrated and described. In practice, this process may be commenced in connection with the generation of the two-dimensional view according to the process and examples discussed above and in combination with a "measure" software tool that enables obtaining measurement information relating to one or more elements of the two-dimensional view. However, other ways to commence the process are possible as well.

Once the process is commenced, the process may generally involve the following operations: (i) at block 1102, the computing device may generate a two-dimensional view of a three-dimensional drawing file; (ii) at block 1104, the computing device may receive a first user input indicating a selection of a first mesh, wherein the selection comprises a first selection point that establishes a first end point; (iii) at block 1106, the computing device, based on receiving the first user input, may generate (1) a first representation indicating an alignment of the first end point with at least one corresponding geometric feature of the first mesh and (2) a second representation indicating a set of one or more directions, originating from the first end point, along which dimensioning information may be added to the cross-sectional view; (iv) at block 1108, the computing device may receive a second user input indicating a given direction, from the set of one or more directions, along which the dimensioning information is to be added; (v) at block 1110, the computing device, based on receiving the second user input, may generate a dynamic representation of the dimensioning information along the given direction, originating from the first end point to a second end point; (vi) at block 1112, the computing device may receive a third user input indicating that the second user input is complete; and (vii) at block 1114, the computing device, based on receiving the third user input, may add the dimensioning information to the cross-sectional view between the first end point and the second end point. Each of these operations will now be discussed in further detail and with reference to FIGS. 12A-12E.

Figure 12A:
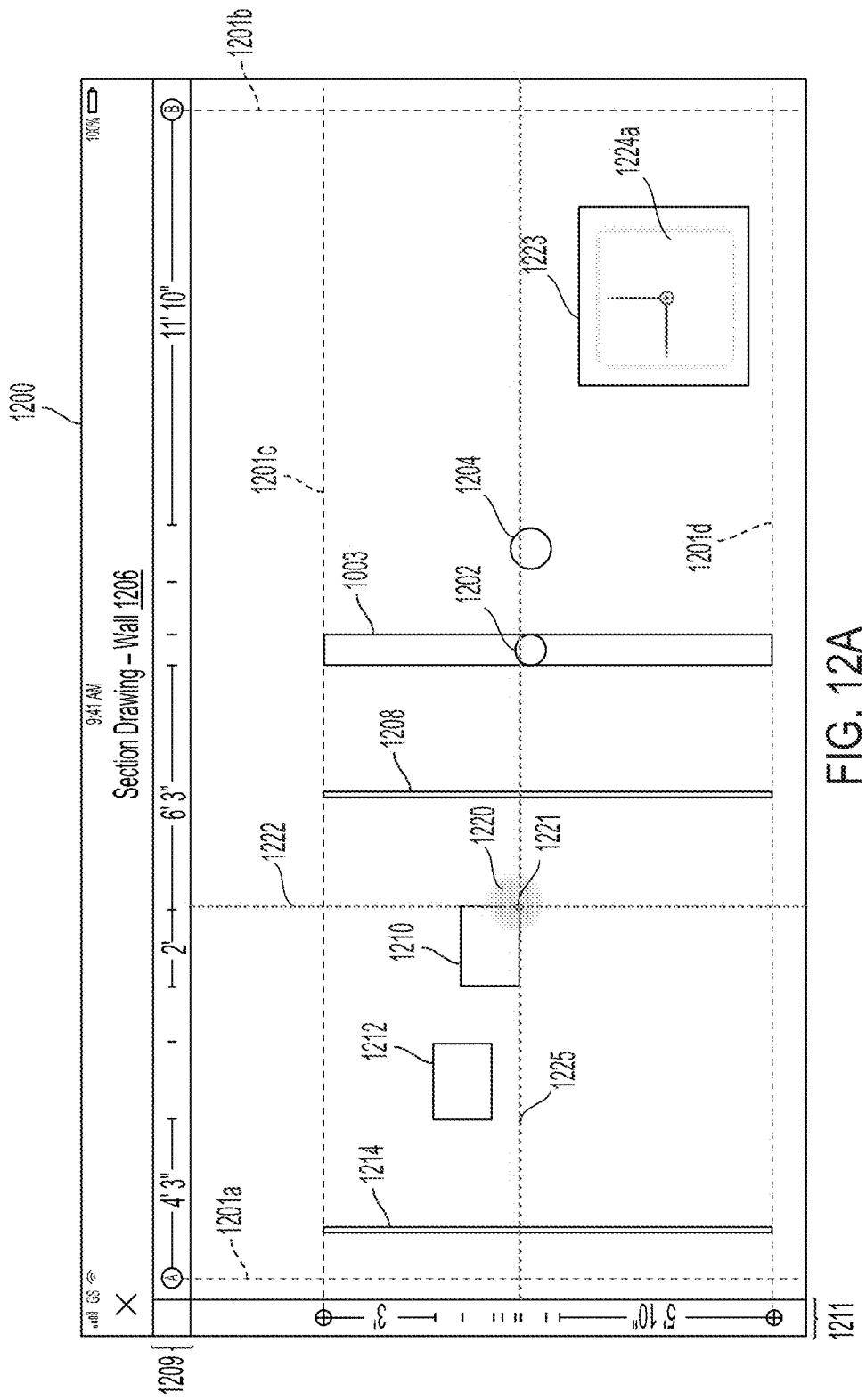
FIG. 12A depicts an example two-dimensional view of a three-dimensional drawing file, in accordance with one embodiment of the present disclosure.

At block 1102, the computing device may generate a two-dimensional view of a three-dimensional drawing file, as generally discussed above. For instance, FIG. 12A shows an example two-dimensional view 1200 that may be generated according to the examples discussed above. Similar to FIGS. 6A, 9A, and 10B, the view 1200 may be a cross-sectional view taken through a wall 1206, showing the wall's intersection with a first pipe 1202, a second pipe 1204, columns 1208 and 1214, and air ducts 1210 and 1212, among other elements of the construction project. Gridlines 1201a, 1201b, 1201c and 1201d are also shown in the view 1200. In some other implementations, as discussed above, the computing device 200 might not add the gridline information to the two-dimensional view 1200 unless an input is received requesting this information.

Like in FIGS. 6A, 9A, and 10B, one or more dimensions may be shown along a horizontal dimensioning reference bar 1209 shown along the top of the view 1200. Additionally, one or more dimensions may be shown along the left side of the view 1200 in a vertical dimensioning reference bar 1211. However, in some implementations, after the process for adding dimensioning information to a generated two-dimensional view is commenced using the disclosed software technology in combination with a "measure" software tool for obtaining measurement information as mentioned above, one or both of the dimensioning reference bars 1209 or 1211 and their respective dimensions may not be shown. Regardless, a construction professional may be interested in viewing additional dimensioning information corresponding to one or more of the elements in the view 1200, such as dimensioning information between a given first mesh and a given second mesh that is not reflected in one of the dimensioning bars. Accordingly, the construction professional might provide a series of inputs within the two-dimensional view 1200 in order to indicate additional dimensioning information that is desired. The series of inputs may generally comprise select, drag, and release inputs that may be entered in succession. However, the inputs may take different forms as well.

To illustrate with an example, the construction professional may wish to view dimensioning information between two elements in the two-dimensional view 1200, such as the air duct 1210 and the column 1208. Therefore, the construction professional may provide a first user input to select a first element, which may be the air duct 1210. The first user input may be provided in various ways. As one possibility, the first user input may take the form of a touch input (e.g., using a finger or a stylus) that is enabled by a touchscreen display of the computing device 200. As another possibility, the first user input may take the form of a click input that is provided by a mouse or a trackpad of the computing device 200. Other examples are also possible.

Thus, at block 1104, the computing device 200 may receive a first user input indicating a selection of a first mesh within the view 1200. The selection provided by the first user input may comprise a selection point that indicates a general area of the mesh that the construction professional has selected. Based on the selection point, the computing device may establish a first end point for the additional dimensioning information that is to be added to the view 1200.

The first end point may be established based on the selection point in various ways. As one possibility, the first end point may be determined by the computing device 200 based on a proximity of the selection point to a geometric feature of the mesh. For instance, the computing device 200 may identify a given point along an edge, corner, or at the center of the mesh that is in closest proximity to the selection point and may determine that the first end point should be fixed at the given point. Other possibilities also exist.

As shown in FIG. 12A, the construction professional may have provided a touch input selecting the air duct 1210 and the selection point 1220 may generally correspond to the bottom right section of the air duct 1210. In this regard, it should be understood that a selection point as discussed herein might represent an area that is larger than a single geometric point. For instance, a selection point associated with a touch input may encompass an area in the two-dimensional view 1200 that corresponds to the user's fingertip or stylus that is used to provide the touch input. As seen in FIG. 12A, the selection point 1220 may encompass portions of a right edge and a bottom edge of the air duct 1210. The computing device 200 may determine that a given point at an intersection (e.g., a corner) of the right edge and the bottom edge of the air duct 1210 is in closest proximity to a center of the selection point 1220 and may thus determine that a first end point 1221 for new dimensioning information should be fixed at the bottom right corner of the air duct 1210.

Based on receiving the first input indicating that a mesh has been selected, at block 1106, the computing device 200 may update the view 1200 to include one or more additional elements. In one aspect, the computing device 200 may update the view 1200 by generating a first representation that indicates an alignment of the first end point 1221 with one or more corresponding geometric features of the selected mesh. As one possibility, the first representation may take the form of one or more guidelines that serve to indicate the first end point's location within the view 1200 relative to the other elements shown in the view 1200. For example, if the first end point 1221 is established along a vertical edge of the selected mesh, the computing device 200 may display a vertical guideline spanning the length of the two-dimensional view that corresponds to a vertical axis of the mesh. As another example, if the first end point 1221 is established along a horizontal edge of the selected mesh, the computing device 200 may display a horizontal guideline spanning the width of the two-dimensional view that corresponds to a horizontal axis of the mesh. As yet another example, if the first end point 1221 is established at a corner or a center of the selected mesh, the computing device 200 may display a vertical guideline spanning the length of the two-dimensional view and corresponding to a vertical axis of the selected mesh and a horizontal guideline spanning the width of the two-dimensional view and corresponding to a horizontal axis of the selected mesh. Numerous other orientations for such guidelines are also possible depending on the shape and features of the selected mesh, including guidelines arranged along non-perpendicular axes, guidelines arranged radially to a curve, or guidelines arranged along a tangent to a curve, among other possibilities. As shown in FIG. 12A, because the first end point 1221 is located at a corner of the air duct 1210, the view 1200 includes two guidelines 1222 and 1225, respectively corresponding to a vertical axis and a horizontal axis of the air duct 1210. Further, other representations to indicate the alignment of the first end point 1221 with a corresponding feature of the selected mesh are also possible.

In another aspect, based on receiving the first input, the computing device 200 may display a selection view, which may be a window or similar interface element that is overlaid on another portion of, or otherwise incorporated into, the two-dimensional view 1200. In some implementations, the selection view may additionally include one or more textual indicators, such as a label or a description that serves to provide the construction professional with contextual and/or instructional information. The selection view may comprise a scaled representation of the area comprising the first end point. In this regard, the scaled representation may take the form of a mirrored representation (e.g., a 1:1 scaled representation), a magnified representation (e.g., a 2:1 scaled representation), or a representation comprising some other proportional dimension of the area comprising the first end point. As shown in FIG. 12A, the selection view 1223 may comprise a scaled representation that takes the form of a magnified representation 1224*a* of the area comprising the first end point 1221, thereby providing a clearer depiction of the portion of the view 1200 that comprises the selection point 1220 and first end point 1221. For instance, it is possible that while the construction professional is providing a touch input to select the air duct 1210, the portion of the view 1200 comprising at least the selection point 1220 may become obstructed from the construction professional's view by the construction professional's finger or stylus that is being used to provide the touch input. Thus, the magnified representation 1224*a* of the selection view 1223 may serve to provide the construction professional with an unobstructed view of the area comprising the selection point 1220 and first end point 1221, which may aid the construction professional in making adjustments to the selection point 1220. For instance, after providing the initial touch input to select the mesh 1210, the construction professional may determine, based on the magnified representation 1224*a* displayed in the selection view 1223, that the current first end point 1221 does not reflect the portion of the mesh that the construction professional intended to select and an adjustment to the selection point 1220 is required. The construction professional may then release the touch input and enter a new touch input to select a different portion of the mesh. In turn, the computing device 200 may update the magnified representation 1224*a* to reflect a new selection point 1220 and a new first end point 1221 based on the new touch input.

In yet another aspect, based on receiving the first input, the computing device 200 may generate a second representation indicating a set of one or more directions, originating from the first end point 1221, along which the construction professional may provide a second user input for obtaining the additional dimensioning information. The set of one or more directions may be determined in various ways. As one possibility, the set of one or more directions may be determined based on the location of the first end point 1221 relative to one or more geometric features of the selected mesh. In this regard, dimensioning information will generally be measured in a direction moving perpendicularly away from a given axis along which the first end point 1221 lies. For example, if the first end point is established along only a vertical edge of the selected mesh, the computing device 200 may determine that the set of one or more directions should include at least one horizontal direction but no vertical directions, because dimensioning information will be measured in a horizontal direction from the first end point. As another example, if the first end point is established along only a horizontal edge of the selected mesh, the computing device 200 may determine that the set of one or more directions should include at least one vertical direction but no horizontal directions, because dimensioning information will be measured in a vertical direction from the first end point. As yet another example, if the first end point is established at an intersection of a horizontal edge and a vertical edge of the selected mesh (e.g., a corner), such as the first end point 1221 shown in FIGS. 12A-12E, the computing device 200 may determine that the set of one or more directions should include both vertical and horizontal directions, because dimensioning information may be measured in either a vertical or horizontal direction from the first end point 1221.

Figure 12B:
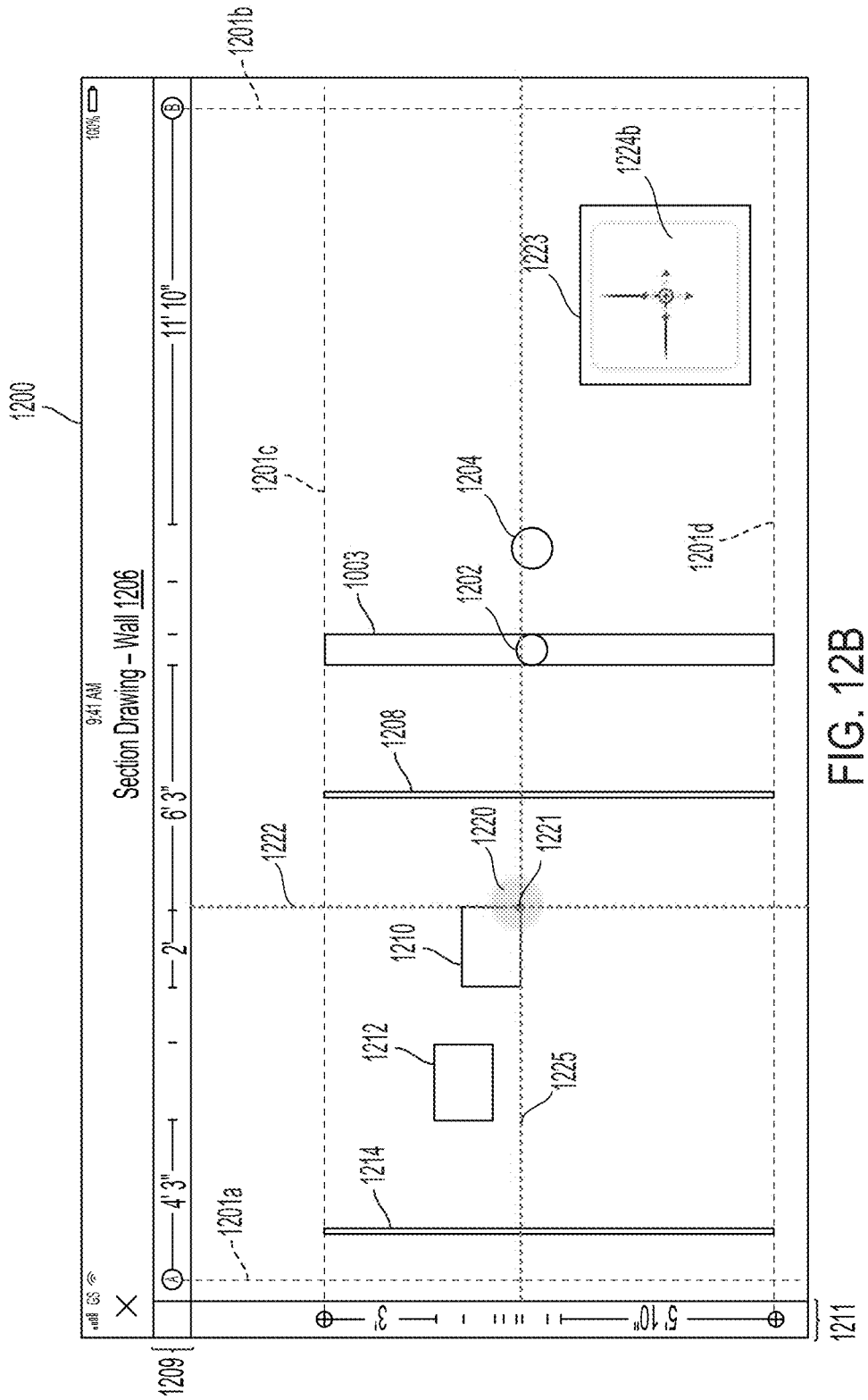
FIG. 12B depicts another example two-dimensional view of the three-dimensional drawing file shown in FIG. 12A.

The computing device 200 may then update the scaled representation of the selection view to include the second representation indicating the set of one or more directions. FIG. 12B includes an updated magnified representation 1224*b* that displays a visual indication of a set of four directions in which the construction professional may provide a second input for indicating the additional dimensioning information that is desired. As discussed above, the computing device 200 may have determined the set of four directions based on the location of the first end point 1221 at a corner of the air duct 1210. In some implementations, the determined set of one or more directions that is displayed in the updated magnified representation 1224*b* may comprise an animation of the determined set of one or more directions. As one example, the animation may display, for each of the one or more directions, a respective arrow that successively extends and retracts in a "pointing" fashion, thereby indicating to the construction professional that the first end point may be dragged in that direction to generate the additional dimensioning information. Other types of animations are also possible, including blinking or pulsing indicators, indicators that cycle through different colors, etc.

At block 1108, the computing device 200 may receive a second user input indicating a given direction, from the set of one or more directions determined at block 1106, along which additional dimensioning information is desired. The second user input may comprise a dragging movement of the selection point along the given direction. The dragging movement may be provided in various ways. As one example, if the first user input comprised a touch input that was provided by the construction professional at a touch screen of the computing device 200 by using a finger or stylus, the dragging movement may comprise dragging the finger or stylus along the given direction. As another example, if the first user input comprised a click input that was provided by the construction professional by using a mouse (or a trackpad, etc.), the dragging input may comprise dragging the mouse along the given direction. Other examples are also possible.

At block 1110, based on receiving the second user input, the computing device 200 may generate a dynamic representation of the desired dimensioning information along the given direction. In this regard, the dynamic representation and the two-dimensional view 1200 may be updated continuously, or substantially continuously, as the construction professional continues to provide the second user input (e.g., as the construction professional continues to drag the selection point).

Figure 12C:
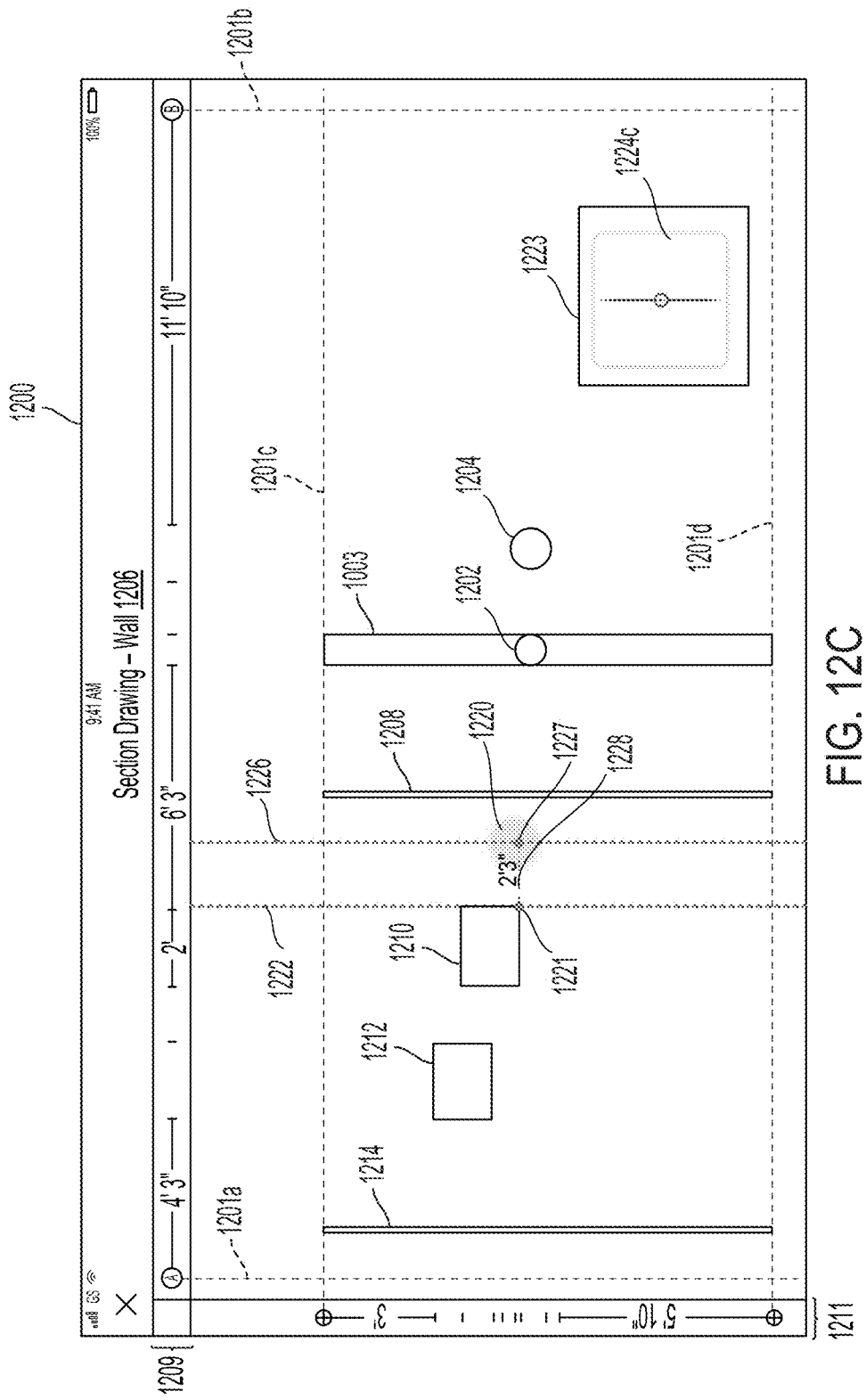
FIG. 12C depicts another example two-dimensional view of the three-dimensional drawing file shown in FIGS. 12A-12B.

FIG. 12C depicts the view 1200 after the construction professional has begun to provide the second input by dragging the selection point 1220 horizontally to the right from the first end point 1221. The dynamic representation that is generated by the computing device 200 in response to receiving the second user input may include various components. For instance, as shown in FIG. 12C, the dynamic representation 1228 may include a second end point 1227 that follows the movement of the selection point 1220, originating from the first end point 1221, based on the second user input. Further, the dynamic representation 1228 may include an indicator (e.g., a dotted line) that traces a distance between a current location of the second end point 1227 and the location of the first end point 1221 based on the movement of the selection point 1220 in response to the second user input. The dynamic representation 1228 may further include a visual representation, such as an alphanumeric label, that is dynamically updated to reflect the distance between the first end point 1221 and the second end point 1227 based on the current location of the second end point 1227.

Additionally, the computing device 200 may update the view 1200 in other ways. In one aspect, the computing device 200 may update the view 1200 to include an additional guideline 1226 that indicates an alignment of the second end point 1227 to the corresponding geometric feature of the air duct 1210 as described above, and which may be parallel to the vertical guideline 1222. The vertical guideline 1222 may serve to identify the location of the first end point 1221 relative to the other elements displayed in the view 1200, and the additional guideline 1226 may serve to identify the location and movement of the second end point 1227 relative to the location of the first end point 1221 and the other elements displayed in the view 1200. Further, based on the second user input, the computing device 200 may update the view 1200 to remove the horizontal guideline 1225 previously shown in FIGS. 12A and 12B. Still further, the computing device 200 may display an updated magnified representation 1224c to indicate the movement of the second end point 1227 based on the second user input.

Figure 12D:
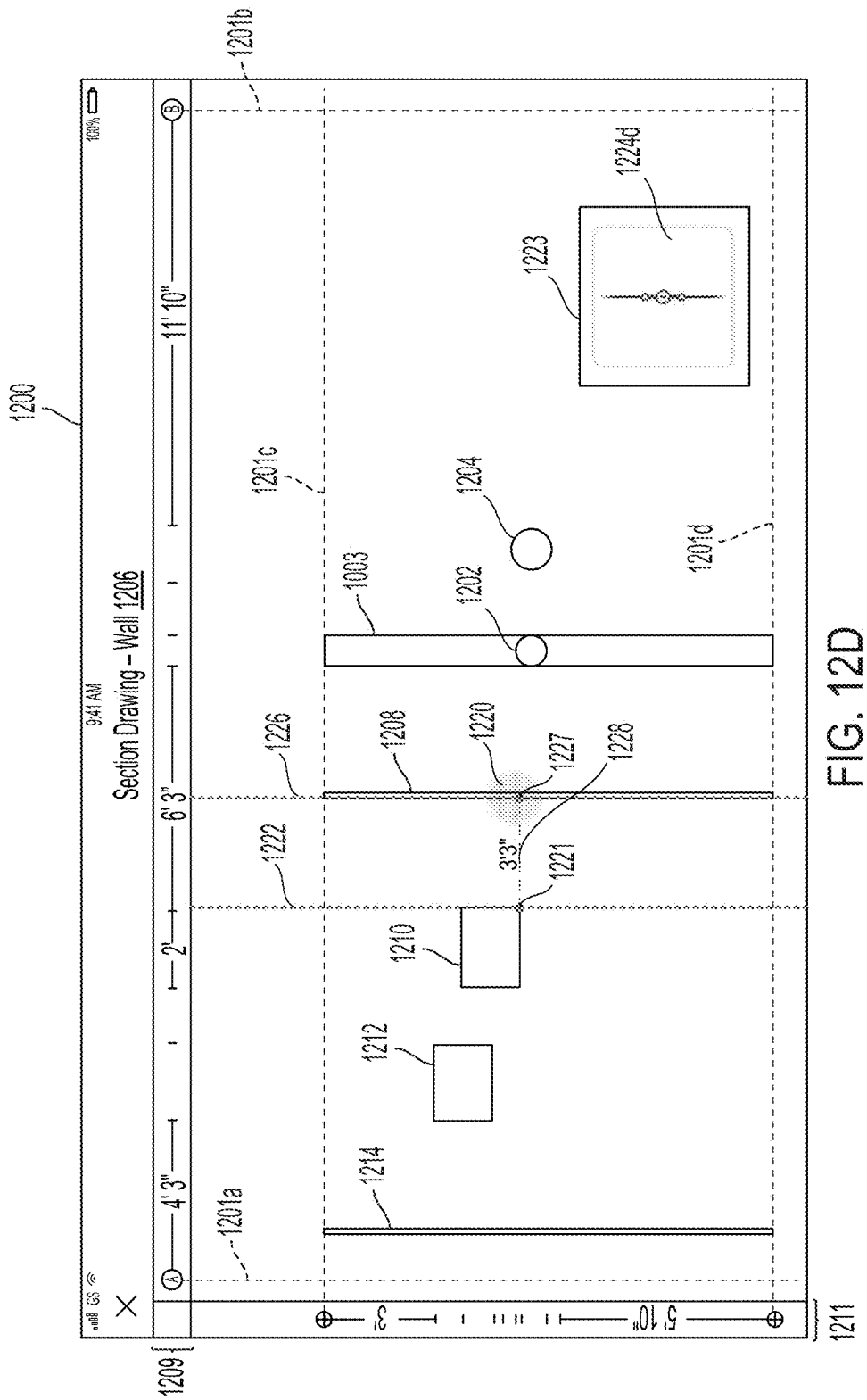
FIG. 12D depicts another example two-dimensional view of the three-dimensional drawing file shown in FIGS. 12A-12C.

The construction professional may continue providing the second input (e.g., dragging the selection point) until a desired location for the second end point 1227 within the view 1200 is reached. When the construction professional has reached the desired location, the construction professional may discontinue dragging the selection point 1220. FIG. 12D shows the view 1200 after the construction professional has dragged the selection point 1220 until the second end point 1227 has reached a desired location—that is, the column 1208, at which point the second end point 1227 may "snap" to the column 1208. In turn, the view 1200 may be updated in various ways to indicate that the second end point has snapped to an element within the view 1200. As one possibility, the view 1200 may be updated to outline or highlight the element to which the second end point has snapped. For example, the view 1200 may be updated to outline the element in a bolded outline and/or a different color to indicate that the second end point has snapped to the element. Additionally, or alternatively, the element may be highlighted in a different color to indicate that the second end point has snapped to the element. Other examples are also possible. As another possibility, the view 1200 may be updated to include a marker (e.g., an arrow, a pin, etc.) to indicate that the second end point has snapped to the element. As yet another possibility, the view 1200 may be updated to outline or highlight (e.g., make bold, highlight in a different color, etc.) the additional gridline corresponding to the second end point to indicate that the second end point has snapped to the element. Other examples are also possible. Further, the computing device 200 may display an updated magnified representation 1224d to indicate that the second end point 1227 has snapped to the column 1208. The updated magnified representation 1224d may comprise an animated indication that the second end point has snapped to an element within the view 1200. In some implementations, the computing device 200 may cause the second end point to automatically "snap" to a given element (e.g., a second mesh, a gridline, etc.) when the computing device 200 determines that the second end point is within a given proximity (e.g., ⅛ of an inch, etc.) of the given element. However, if the given element does not reflect the desired location for the second end point, the construction professional may continue dragging the selection point, even after it has snapped to the given element, until the desired location is reached. Furthermore, while the desired location in the scenario depicted by FIG. 12D is the column 1208, it is possible that the desired location may be any element (e.g., a mesh, a gridline, etc.) within the view 1200, or even an empty space within the view 1200.

At block 1112, the computing device may receive a third user input indicating that the second user input is complete. The third input may establish a fixed location of the second end point for the dimensioning information. The third user input may take various forms. As one possibility, the third user input may take the form of a release of a finger or stylus, concluding the touch and drag inputs discussed above. As another possibility, the third user input may take the form of a click input, such as a release of a click (e.g., a "MouseUp" input) or a double click using a mouse or trackpad of the computing device 200. Other examples are also possible.

Figure 12E:
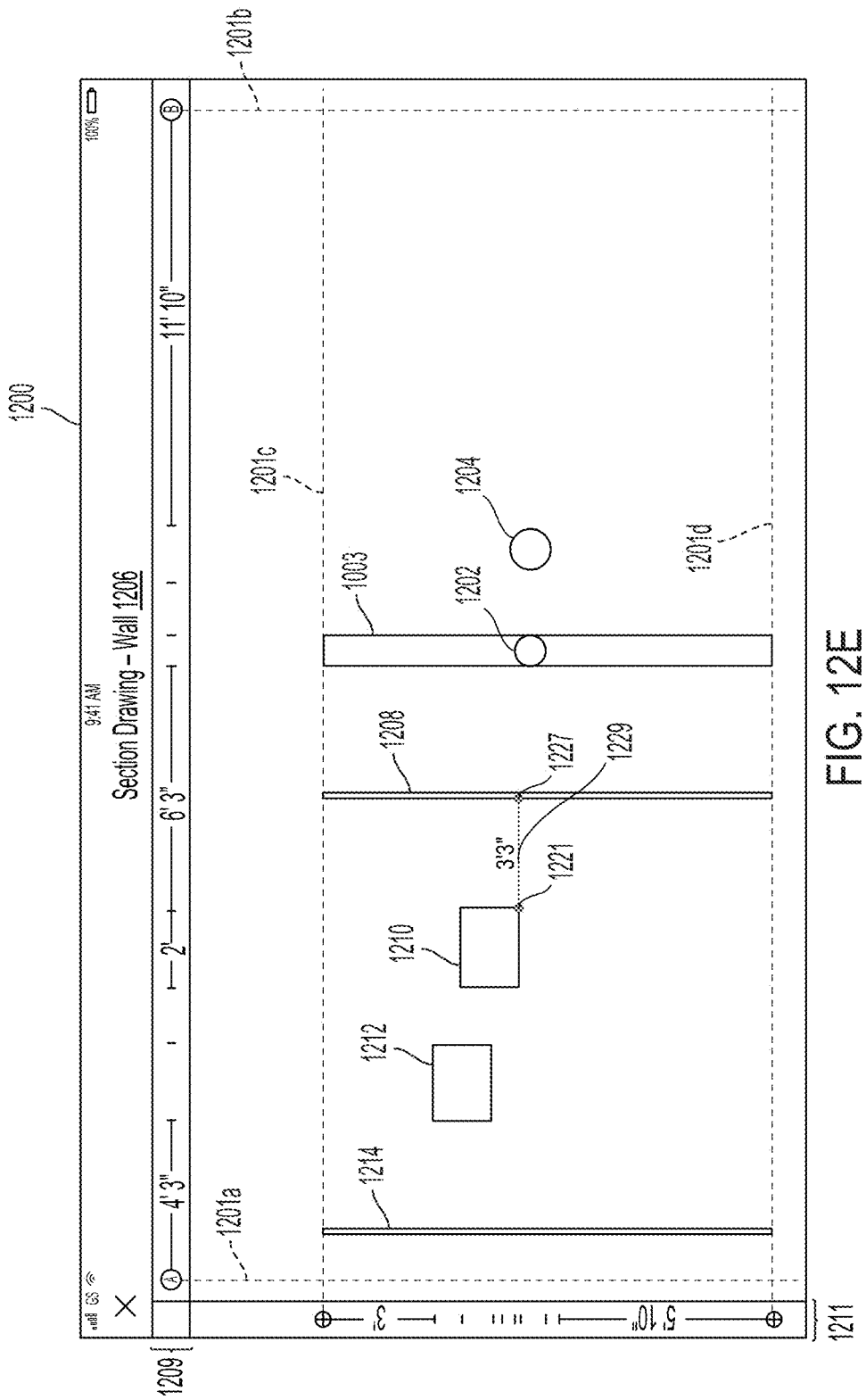
FIG. 12E depicts another example two-dimensional view of the three-dimensional drawing file shown in FIGS. 12A-12D.

At block 1114, based on receiving the third input, the computing device may add the desired dimensioning information to the view 1200 between the first end point 1221 and the second end point 1227. The added dimensioning information may take various forms. FIG. 12E shows the two-dimensional view 1200 after the computing device 200 has received the third input fixing the location of the second end point 1227. As shown in FIG. 12E, the computing device 200 may update the view 1200 to include the additional dimensioning information, which may take the form of a representation 1229 that includes an updated indicator (now shown as a solid line) and an alphanumeric label displaying the distance between the first end point 1221 on the air duct 1210 and the second end point 1227 on the column 1208. Furthermore, the selection point 1220 and the selection view 1223 may no longer be displayed. Still further, the view 1200 may be updated to remove any outlining or highlighting effects that were previously applied to the guidelines 1222 and 1226 as described above. In some implementations, as shown in FIG. 12E, the view 1200 may be updated to no longer include the guidelines 1222 and 1226 at all.

In some implementations, the dimensioning information may be adjusted by moving one or more of the end points 1221 or 1227 along a horizontal direction. In such an implementation, the computing device 200 may repeat one or more of the functions described at blocks 1102-1114. For instance, the computing device may update the view 1200 based on receiving a new first input to display a selection point, one or more guidelines, and the selection view comprising a magnified view. Other examples are also possible.

In some implementations, the construction professional may wish to add more additional dimensioning information to the view 1200. Thus, the representation 1229 may be moved (either based on an input from the construction professional or automatically by the computing device) to a different location in the view 1200 to facilitate input of a new selection point. The computing device 200 may then repeat one or more of the functions described at blocks 1102-1114 in response to a new first input by the construction professional. In such implementations, the computing device 200 may continue to display the representation 1229 in the view 1200 while performing one or more of the functions described at blocks 1102-1114 in order to add the additional dimensioning information. Alternatively, the computing device 200 may temporarily hide the representation 1229 until the additional dimensioning information is added and then display the representation 1229 along with the additional desired dimensioning information. Other possibilities also exist.

Although the examples discussed above with respect to FIGS. 11-12E involve cross-sectional views through walls and dimensioning information for meshes, the features disclosed herein may be used for various other applications as well.

V. Conclusion

Example embodiments of the disclosed innovations have been described above. Those skilled in the art will understand, however, that changes and modifications may be made to the embodiments described without departing from the true scope and spirit of the present invention, which will be defined by the claims.

Further, to the extent that examples described herein involve operations performed or initiated by actors, such as "users" or other entities, this is for purposes of example and explanation only. Claims should not be construed as requiring action by such actors unless explicitly recited in claim language.

The invention claimed is:

1. A computing device comprising:
at least one processor;
at least one non-transitory computer-readable medium; and
program instructions stored on the at least one non-transitory computer-readable medium that are executable by the at least one processor such that the computing device is configured to:
display a two-dimensional (2D) cross-sectional view of a three-dimensional drawing file, the 2D cross-sectional view including at least two meshes;
receive a set of user inputs indicating a request for dimensioning information to be added to the 2D cross-sectional view, wherein the set of user inputs (i) indicates a selection point in the 2D cross-sectional view and (ii) comprises a drag input;
based on the selection point, establish a first end point at a first mesh; and
based on the drag input:
display, along a given direction, a representation of second dimensioning information involving the first mesh; and
dynamically update the representation of the second dimensioning information originating from the first end point to a second end point.

2. The computing device of claim 1, further comprising program instructions stored on the at least one non-transitory computer-readable medium that are executable by the at least one processor such that the computing device is configured to:
determine that the drag input has ended; and
based on determining that the drag input has ended, add the second dimensioning information to the 2D cross-sectional view, the second dimensioning information indicating a measurement between the first end point and the second end point.

3. The computing device of claim 2, wherein the set of user inputs further comprises a release input, and wherein the program instructions that are executable by the at least one processor such that the computing device is configured to determine that the drag input has ended comprise program instructions that are executable by the at least one processor such that the computing device is configured to:
detect the release input.

4. The computing device of claim 1, wherein the program instructions that are executable by the at least one processor such that the computing device is configured to establish the first end point comprise program instructions that are executable by the at least one processor such that the computing device is configured to:
based on the selection point, identify a given point on an edge, a corner, or a center of the first mesh; and
fix the first end point at the given point.

5. The computing device of claim 4, wherein the given point is closest in proximity to the selection point from one or more other points on the edge, the corner, or the center of the first mesh.

6. The computing device of claim 1, further comprising program instructions stored on the at least one non-transitory computer-readable medium that are executable by the at least one processor such that the computing device is configured to:
display at least one guideline indicating an alignment of the first end point with a corresponding geometric feature of the first mesh.

7. The computing device of claim 1, further comprising program instructions stored on the at least one non-transitory computer-readable medium that are executable by the at least one processor such that the computing device is configured to:
after receiving the set of user inputs indicating the selection point, determine one or more directions originating from the first end point along which the second dimensioning information may be added to the 2D cross-sectional view; and
display an indication of the one or more directions, wherein the given direction is selected from the one or more directions.

8. The computing device of claim 7, wherein the one or more directions are determined based on at least one corresponding geometric feature of the first mesh.

9. The computing device of claim 8, wherein the first end point is aligned with a vertical edge of the first mesh, and wherein the one or more directions include a horizontal direction but not a vertical direction.

10. The computing device of claim 8, wherein the first end point is aligned with a horizontal edge of the first mesh, and wherein the one or more directions include a vertical direction but not a horizontal direction.

11. The computing device of claim 8, wherein the first end point is aligned with (i) an intersection of a vertical edge and a horizontal edge of the first mesh or (ii) a center of the first mesh, and wherein the one or more directions include both a horizontal direction and a vertical direction.

12. The computing device of claim 1, wherein the computing device further comprises program instructions stored on the at least one non-transitory computer-readable medium that are executable by the at least one processor such that the computing device is configured to:
dynamically update a location of the second end point based on the drag input.

13. The computing device of claim 1, further comprising program instructions stored on the at least one non-transitory computer-readable medium that are executable by the at least one processor such that the computing device is configured to:
display a scaled representation of an area of the 2D cross-sectional view comprising the first end point;
dynamically update the scaled representation based on the drag input; and
after determining that the drag input has ended, discontinue displaying the scaled representation.

14. The computing device of claim 13, further comprising program instructions stored on the at least one non-transitory computer-readable medium that are executable by the at least one processor such that the computing device is configured to:
based on the drag input, dynamically update the scaled representation to indicate that the second end point is nearing a second mesh within the 2D cross-sectional view; and
based further on the drag input, dynamically update the scaled representation to indicate that the second end point has connected to a portion of the second mesh, wherein the portion of the second mesh comprises a fixed location of the second end point.

15. The computing device of claim 1, wherein the given direction is a first direction, the computing device further comprising program instructions stored on the at least one non-transitory computer-readable medium that are executable by the at least one processor such that the computing device is configured to:
while receiving the drag input, determine a change in a direction of the drag input from the first direction to a second direction; and
based on the change, dynamically update the representation of the second dimensioning information originating from the first end point to the second end point along the second direction.

16. A non-transitory computer-readable medium, wherein the non-transitory computer-readable medium is provisioned with program instructions that, when executed by at least one processor, cause a computing device to:
display a two-dimensional (2D) cross-sectional view of a three-dimensional drawing file, the 2D cross-sectional view including at least two meshes;
receive a set of user inputs indicating a request for dimensioning information to be added to the 2D cross-sectional view, wherein the set of user inputs (i) indicates a selection point in the 2D cross-sectional view and (ii) comprises a drag input;
based on the selection point, establish a first end point at a first mesh; and
based on the drag input:
display, along a given direction, a representation of second dimensioning information involving the first mesh; and
dynamically update the representation of the second dimensioning information originating from the first end point to a second end point.

17. The non-transitory computer-readable medium of claim 16, wherein the non-transitory computer-readable medium is also provisioned with program instructions that, when executed by at least one processor, cause the computing device to:
determine that the drag input has ended; and
based on determining that the drag input has ended, add the second dimensioning information to the 2D cross-sectional view, the second dimensioning information indicating a measurement between the first end point and the second end point.

18. The non-transitory computer-readable medium of claim 16, wherein the program instructions that, when executed by at least one processor, cause the computing device to establish the first end point comprise program instructions that, when executed by at least one processor, cause the computing device to:
based on the selection point, identify a given point on an edge, a corner, or a center of the first mesh; and
fix the first end point at the given point.

19. A method carried out by a computing device, the method comprising:
displaying a two-dimensional (2D) cross-sectional view of a three-dimensional drawing file, the 2D cross-sectional view including at least two meshes;
receiving a set of user inputs indicating a request for dimensioning information to be added to the 2D cross-sectional view, wherein the set of user inputs (i) indicates a selection point in the 2D cross-sectional view and (ii) comprises a drag input;
based on the selection point, establishing a first end point at a first mesh; and
based on the drag input:
displaying, along a given direction, a representation of second dimensioning information involving the first mesh; and
dynamically updating the representation of the second dimensioning information originating from the first end point to a second end point.

20. The method of claim 19, further comprising:
determining that the drag input has ended; and
based on determining that the drag input has ended, adding the second dimensioning information to the 2D cross-sectional view, the second dimensioning information indicating a measurement between the first end point and the second end point.

* * * * *